United States Patent
Kimura et al.

(10) Patent No.: US 12,040,338 B2
(45) Date of Patent: Jul. 16, 2024

(54) IMAGING APPARATUS

(71) Applicant: SONY SEMICONDUCTOR SOLUTIONS CORPORATION, Kanagawa (JP)

(72) Inventors: Katsuji Kimura, Kanagawa (JP); Hirokazu Seki, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 537 days.

(21) Appl. No.: 17/285,550

(22) PCT Filed: Sep. 20, 2019

(86) PCT No.: PCT/JP2019/036933
§ 371 (c)(1),
(2) Date: Apr. 15, 2021

(87) PCT Pub. No.: WO2020/084973
PCT Pub. Date: Apr. 30, 2020

(65) Prior Publication Data
US 2021/0384245 A1 Dec. 9, 2021

(30) Foreign Application Priority Data
Oct. 24, 2018 (JP) .................................. 2018-200401

(51) Int. Cl.
*H01L 27/146* (2006.01)
(52) U.S. Cl.
CPC .. *H01L 27/14627* (2013.01); *H01L 27/14621* (2013.01); *H01L 27/14623* (2013.01); *H01L 27/14643* (2013.01)

(58) Field of Classification Search
CPC ......... H01L 27/14621; H01L 27/14627; H01L 27/14623; G02B 5/201; G02B 13/004
See application file for complete search history.

(56) References Cited

U.S. PATENT DOCUMENTS

| 2009/0200629 A1 | 8/2009 | Asami et al. |
| 2009/0200630 A1 | 8/2009 | Yamamoto |

(Continued)

FOREIGN PATENT DOCUMENTS

| CN | 101366118 A | 2/2009 | |
| CN | 102449523 A * | 5/2012 | ............. G02B 7/021 |

(Continued)

OTHER PUBLICATIONS

International Search Report and Written Opinion of PCT Application No. PCT/JP2019/036933, issued on Dec. 17, 2019, 12 pages of ISRWO.

*Primary Examiner* — Brook Kebede
(74) *Attorney, Agent, or Firm* — CHIP LAW GROUP

(57) ABSTRACT

An imaging apparatus according to an embodiment includes: a solid-state imaging element (11) that has a light-receiving surface on which light-receiving elements are arranged in a two-dimensional matrix manner, a glass substrate (20) that is arranged on the light-receiving surface of the solid-state imaging element, and an infrared cut filter (22) that is arranged on a second surface of the glass substrate via a cavity layer (23), where the second surface is opposite to a first surface facing the light-receiving surface.

10 Claims, 16 Drawing Sheets

(56) References Cited

U.S. PATENT DOCUMENTS

| | | | |
|---|---|---|---|
| 2011/0176022 A1* | 7/2011 | Cho | H01L 27/14632 348/222.1 |
| 2012/0314122 A1* | 12/2012 | Yamashita | G02B 5/1895 359/570 |
| 2018/0083056 A1 | 3/2018 | Seki et al. | |

FOREIGN PATENT DOCUMENTS

| | | |
|---|---|---|
| CN | 109952648 A | 6/2019 |
| JP | 2007-233262 A | 9/2007 |
| JP | 2008-117919 A | 5/2008 |
| JP | 2009-193986 A | 8/2009 |
| JP | 2012-134742 A | 7/2012 |
| JP | 2015-061193 A | 3/2015 |
| JP | 2018-085353 A | 5/2018 |
| JP | 2018-110302 A | 7/2018 |
| JP | 2019-047237 A | 3/2019 |
| KR | 10-0994845 B1 | 11/2010 |
| KR | 10-2019-0097064 A | 8/2019 |
| TW | 200832692 A | 8/2008 |
| WO | 2008/053849 A1 | 5/2008 |
| WO | 2016/152431 A1 | 9/2016 |
| WO | 2018/123643 A1 | 7/2018 |
| WO | 2019/044540 A1 | 3/2019 |

\* cited by examiner

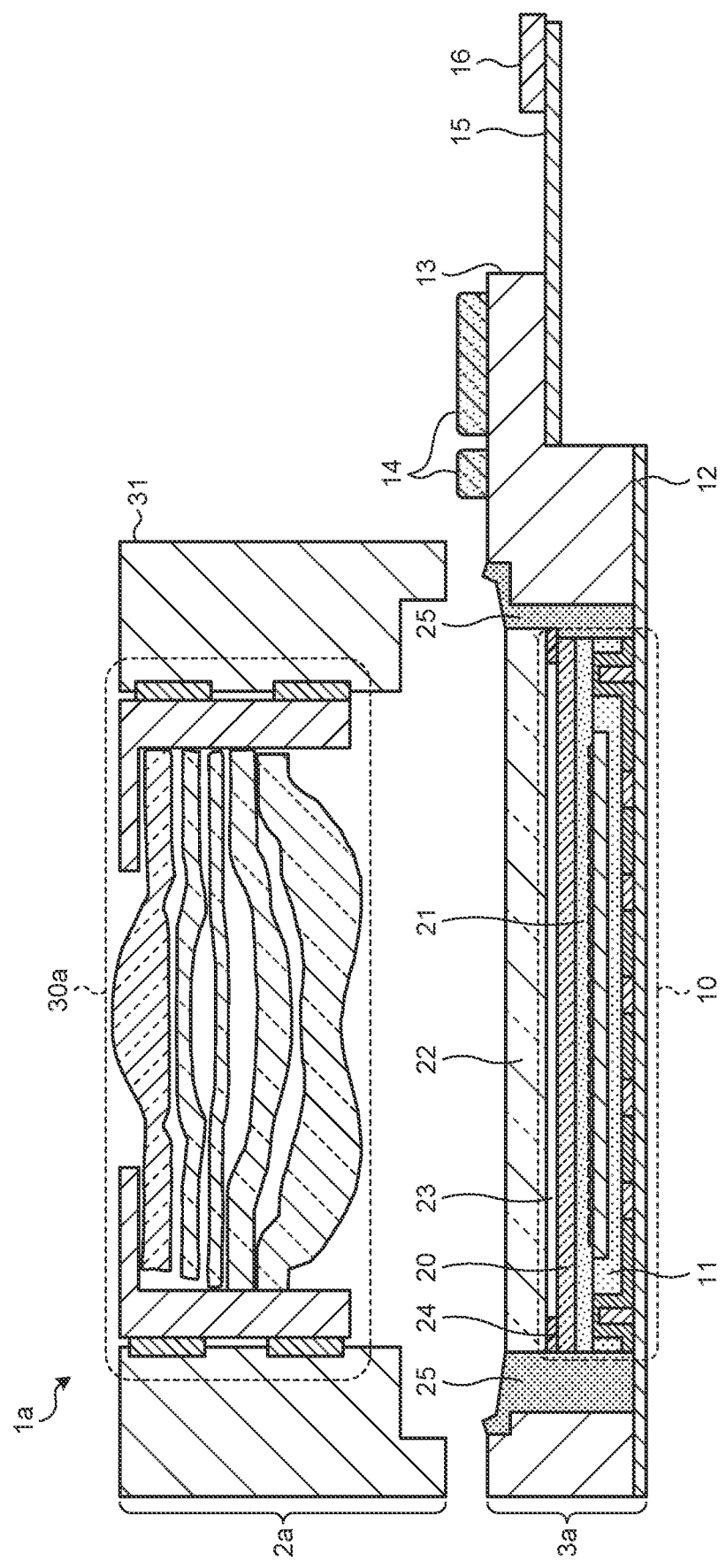

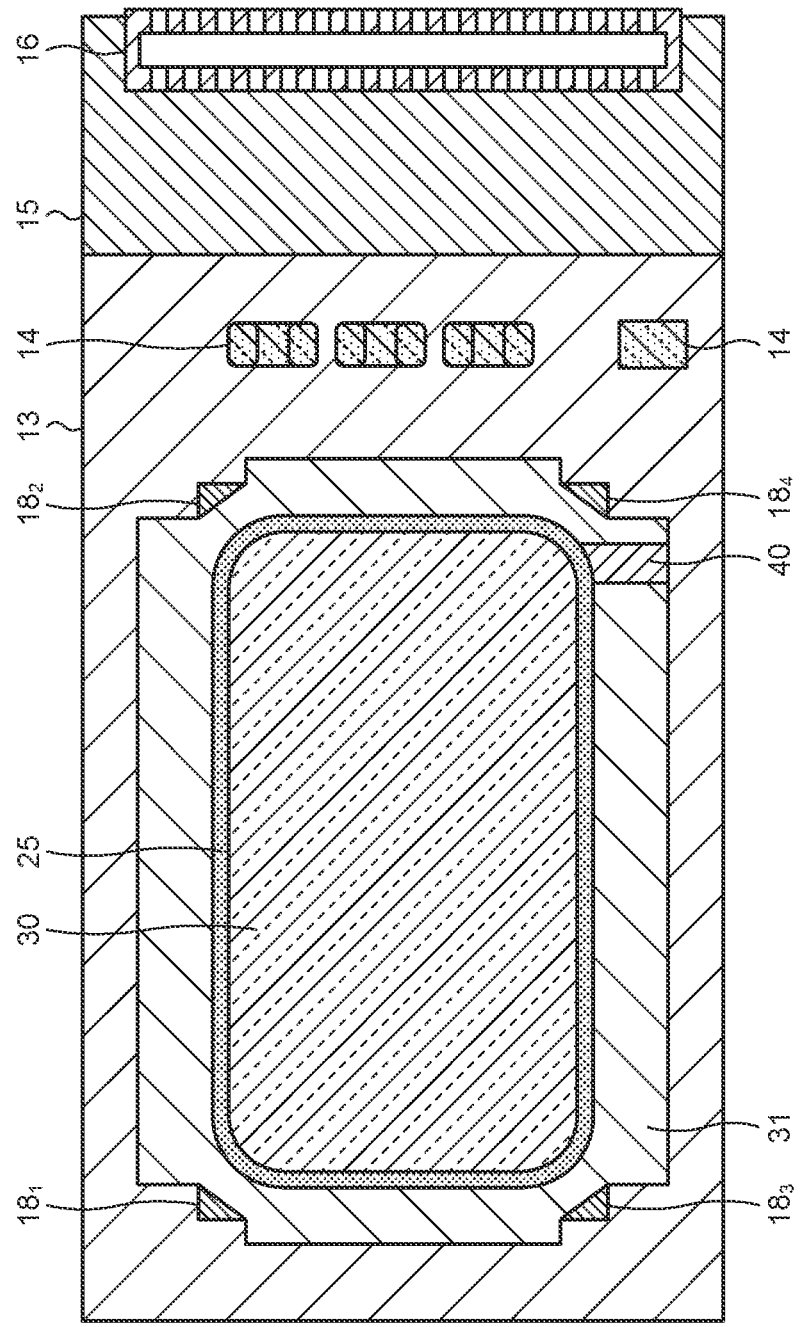

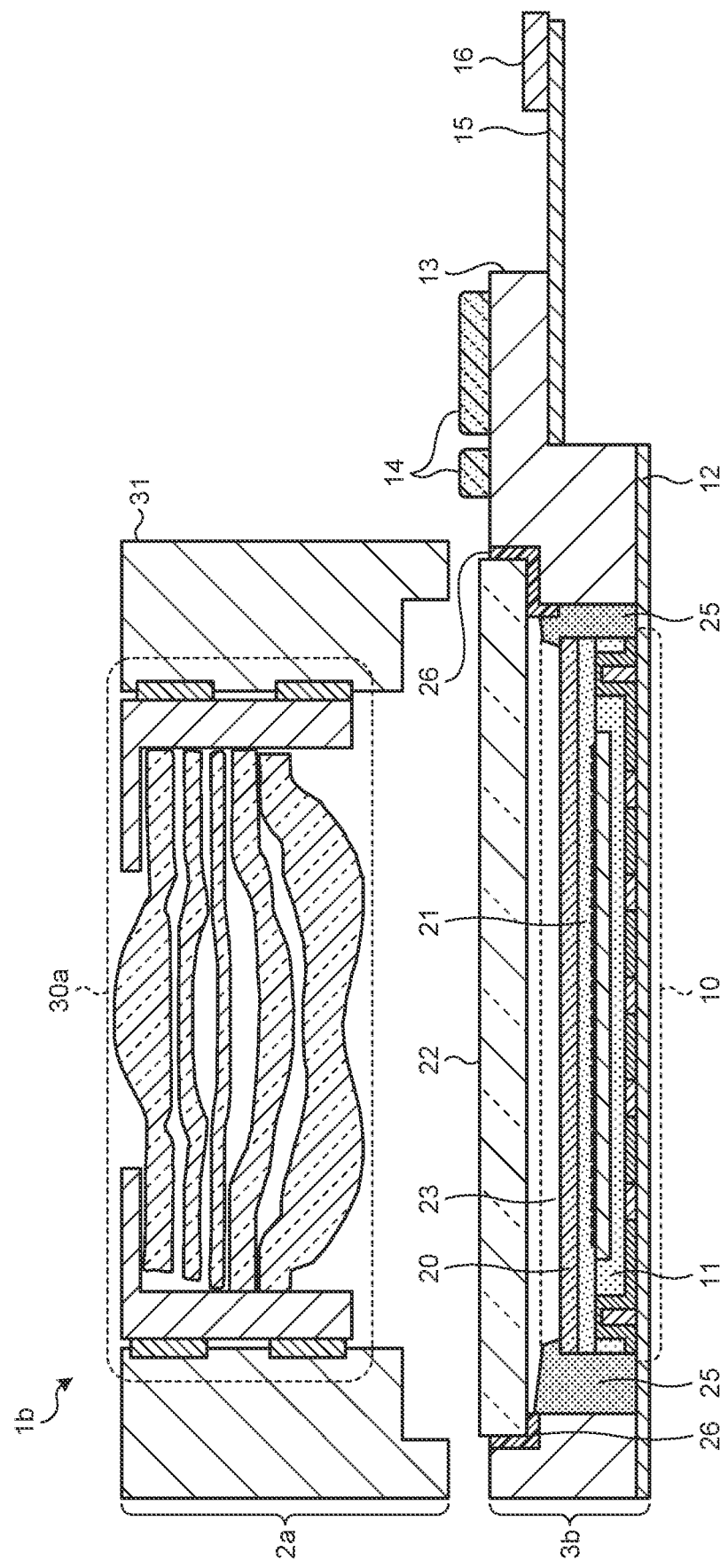

IMAGING APPARATUS

CROSS REFERENCE TO RELATED APPLICATIONS

This application is a U.S. National Phase of International Patent Application No. PCT/JP2019/036933 filed on Sep. 20, 2019, which claims priority benefit of Japanese Patent Application No. JP 2018-200401 filed in the Japan Patent Office on Oct. 24, 2018. Each of the above-referenced applications is hereby incorporated herein by reference in its entirety.

FIELD

The present invention relates to an imaging apparatus

BACKGROUND

In recent years, in a solid-state imaging element as an imaging apparatus that captures an image in a camera-equipped mobile terminal device, a digital still camera, or the like, the number of pixels tends to increase while a size and a height of the apparatus tend to decrease. As one of structures of the solid-state imaging element that realizes the increase in the number of pixels and the decrease in the size and the height of the apparatus, a chip size package (CSP) structure is known. The CSP structure is an extremely small package that is realized with approximately the same size as a single chip. In the solid-state imaging element of the CSP structure, for example, pixels for converting incident light to an electrical signal are formed on a semiconductor substrate, and a glass substrate for fixing the solid-state imaging element and protecting a light-receiving surface is arranged on the light-receiving surface on which the pixels are formed.

In contrast, in the solid-state imaging element of the CSP structure, it is known that a certain phenomenon occurs in which incident object light is received by the pixels on the light-receiving surface, is reflected by the light-receiving surface, enters the glass substrate, is further reflected by a boundary surface between the glass substrate and air, and the reflected light is received by the light-receiving surface.

CITATION LIST

Patent Literature

Patent Literature 1: International Publication No. WO/2016/152431
Patent Literature 2: Japanese Laid-open Patent Publication No. 2015-61193

SUMMARY

Technical Problem

In the solid-state imaging element of the CSP structure, due to the phenomenon as described above, the reflected light that is reflected by the light-receiving surface and the boundary surface between the glass substrate and air is captured around the object light that directly enters the light-receiving surface. The reflected light appears, as flare or ghost with respect to an object image for example, on the captured image, and leads to degradation of image quality of the captured image. It is known that the influence of the above-described phenomenon on the captured image can be reduced by reducing a thickness of the glass substrate. However, there is a problem in that if the thickness of the glass substrate is reduced, the entire strength of the solid-state imaging element is reduced.

An object of the present disclosure is to provide an imaging apparatus that includes a CSP structure, that is able to acquire a captured image with high image quality, and that is able to ensure strength.

Solution to Problem

For solving the problem described above, a imaging apparatus according to one aspect of the present disclosure has a solid-state imaging element that has a light-receiving surface on which light-receiving elements are arranged in a two-dimensional matrix manner; a glass substrate that is arranged on the light-receiving surface of the solid-state imaging element; and an infrared cut filter that is arranged on a second surface of the glass substrate via a cavity layer, the second surface located opposite to a first surface facing the light-receiving surface.

BRIEF DESCRIPTION OF DRAWINGS

FIG. 1A is a cross-sectional view illustrating a configuration example of an imaging apparatus according to a first embodiment.

FIG. 1B is a top vie illustrating the configuration example of the imaging apparatus according to the first embodiment.

FIG. 5 is a cross-sectional view illustrating one example of a configuration of an imaging apparatus according to a modification of the first embodiment.

DESCRIPTION OF EMBODIMENTS

Figure 2:
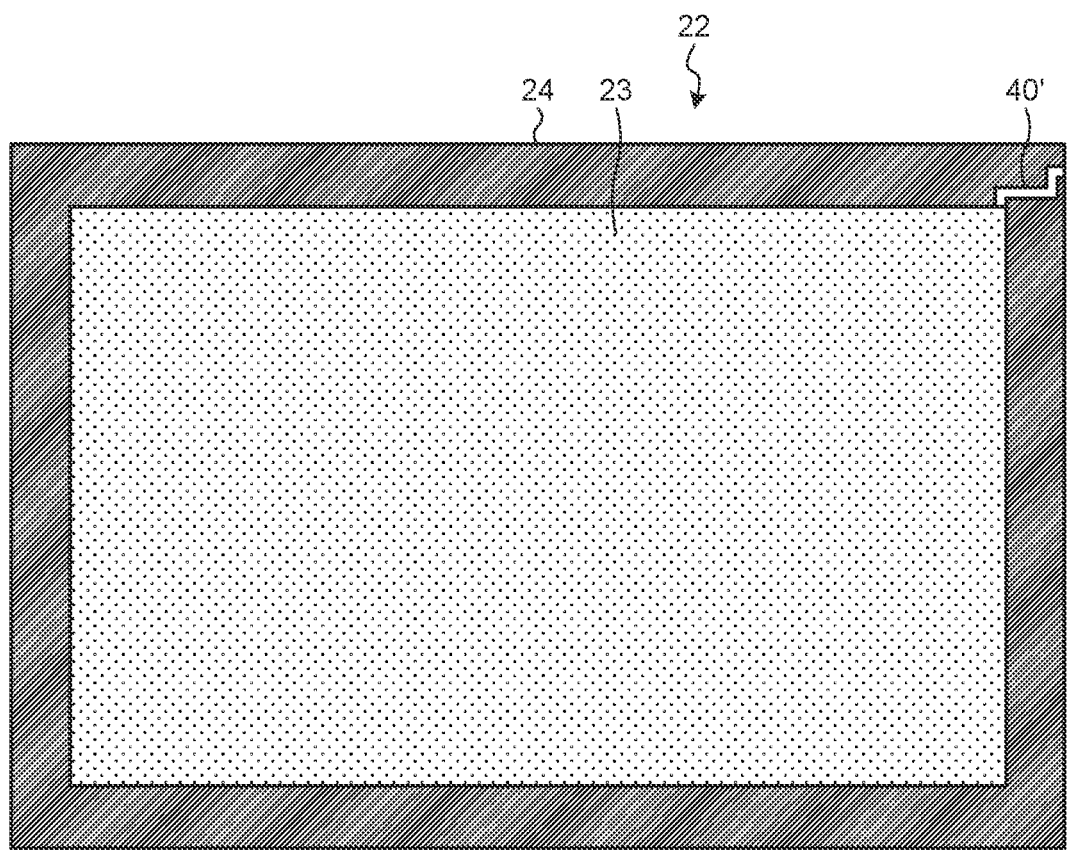
FIG. 2 is a diagram illustrating a specific example of a ventilation pathway that is applicable to the first embodiment and that is adopted when a spacer is arranged in an infrared cut filter.

Embodiments of the present disclosure will be described in detail below based on the drawings. In the description below, the same components are denoted by the same reference symbols, and repeated explanation will be omitted.

First Embodiment

A first embodiment of the present disclosure will be described. An imaging apparatus according to the first embodiment includes a solid-state imaging element including a plurality of light-receiving elements that are arranged in a two-dimensional matrix manner and that perform photoelectric conversion on received light to convert the received light to electrical signals, a glass substrate for fixing the solid-state imaging element and protecting a light-receiving surface, and an infrared cut filter arranged on the glass substrate via a cavity layer (void layer). The imaging apparatus according to the first embodiment may include a lens group for forming an object image on the light-receiving surface of the solid-state imaging element, an actuator that drives the lens group, and a signal processing circuit that performs signal processing on the electrical signals that are output by the light-receiving elements.

While details will be described later, in the imaging apparatus according to the first embodiment, the glass substrate with a smaller thickness than a thickness of the infrared cut filter is used. Further, the glass substrate is firmly fixed to the light-receiving surface of the solid-state imaging element with a transparent member (for example, an adhesive agent) with approximately the same refractive index as that of the glass substrate.

FIGS. 1A and 1B are diagrams illustrating a configuration example of the imaging apparatus according to the first embodiment. FIG. 1A is a cross-sectional view illustrating an exemplary cross section of an imaging apparatus 1a according to the first embodiment cut along a plane including an optical axis of light that is incident on the imaging apparatus 1a. Further, FIG. 1B is an exemplary top view of the imaging apparatus 1a when viewed from a light incident direction.

In FIG. 1A, the imaging apparatus 1a includes an optical unit 2a that includes a lens group 30a and an actuator 31, and an element unit 3a that includes a CSP solid-state imaging element 10, a circuit substrate 12, a circuit substrate 15, a fixing unit 13, and an infrared cut filter 22.

In the optical unit 2a, the lens group 30a includes a plurality of lenses, and forms an object image on a light-receiving surface of a solid-state imaging element 11 (to be described later). The actuator 31 drives a predetermined lens included in the lens group 30a in a vertical direction and a left-right direction (and a front-back direction) in FIG. 1A in a direction facing the CSP solid-state imaging element 10, for example. Accordingly, at least one of an autofocus function and a camera shake correction function is implemented.

Meanwhile, the actuator 31 may have one of the autofocus function and the camera shake correction function, or may be a simple lens holder that does not have both of the autofocus function and the camera shake correction function. Furthermore, autofocus and camera shake correction may be realized by using a different means, such as image processing, other than the actuator 31.

In the element unit 3a, the CSP solid-state imaging element 10 includes the solid-state imaging element 11 as an image sensor using a complementary metal oxide semiconductor (CMOS), and has a chip size package (CSP) structure. The solid-state imaging element 11 is not limited to this example, and may be an image sensor using a charge coupled device (CCD).

The solid-state imaging element 11 includes a plurality of light-receiving elements (for example, photodiodes) that are arranged in a two-dimensional matrix manner, and a drive circuit for driving each of the light-receiving elements. The solid-state imaging element 11 may further include a signal processing circuit that preforms signal processing, such as correlated double sampling (CDS), on a signal that is read from each of the light-receiving elements. In the solid-state imaging element 11, each of the light-receiving elements generates a charge corresponding to intensity of incident light through photoelectric conversion. The solid-state imaging element 11 outputs a pixel signal that is made with an electrical signal corresponding to the charge that is generated by each of the light-receiving elements. The solid-state imaging element 11 is electrically connected to outside via a connection part that is arranged in the CSP solid-state imaging element 10.

More specifically, the solid-state imaging element 11 is configured such that, for example, any of color filters of R (red), G (green), and B (blue) is arranged at an incidence portion on which light is incident in each of the light-receiving elements, and a microlens is further arranged on an incident side of the color filters. A surface on which the microlens is arranged is referred to as the light-receiving surface of the solid-state imaging element 11.

In the CSP solid-state imaging element 10, a transparent glass substrate 20 is arranged at the side of the light-receiving surface of the solid-state imaging element 11. The glass substrate 20 is bonded to the light-receiving surface of the solid-state imaging element 11 with an adhesive agent 21 that is a transparent material, and is fixedly arranged on the solid-state imaging element 11. The glass substrate 20 has a function to fix the solid-state imaging element 11 and protect the light-receiving surface. On a surface of the glass substrate 20 opposite to the surface that is in contact with the adhesive agent 21, the infrared cut filter 22 is arranged via a cavity layer 23. The infrared cut filter 22 is a filter for cutting light in an infrared wavelength range.

The cavity layer 23 is a void layer that is formed between an upper surface of the glass substrate 20 in FIG. 1A and a surface of the infrared cut filter 22 facing the upper surface, and air is present inside the cavity layer 23. A height of the cavity layer 23 is formed by a spacer 24. For example, the spacer 24 is formed on the infrared cut filter 22 in advance, and the infrared cut filter 22 is arranged on the glass substrate 20 via the spacer 24. Accordingly, it is possible to form the cavity layer 23 with the same height as the spacer 24. It is preferable to form the spacer 24 using a material capable of preventing light reflection. Examples of the material as described above include synthetic resin colored in matte black.

Meanwhile, because the cavity layer 23 contains air inside thereof, it is preferable to arrange a pathway that allows ventilation with outside air as illustrated as a ventilation pathway 40 in FIG. 1B in order to prevent deformation due to expansion of air or the like.

FIG. 2 is a diagram illustrating a specific example of the ventilation pathway 40 that is applicable to the first embodiment and that is adopted when the spacer 24 is arranged in the infrared cut filter 22. FIG. 2 illustrates a state in which the infrared cut filter 22 is viewed from a plane facing the glass substrate 20. In the example in FIG. 2, a ventilation pathway 40' for realizing communication between the cavity layer 23 and outside is arranged in a part of the spacer 24 that is arranged on four sides of the infrared cut filter 22. Further, as illustrated in FIG. 2, if the ventilation pathway 40' is formed in a bent shape, it is possible to prevent dust from coming into the cavity layer 23 from outside, which is preferable.

Meanwhile, if the volume of the cavity layer 23 is adequately small, it is possible to omit the ventilation pathway 40'.

A fixing agent 25 fixes the solid-state imaging element 11, the glass substrate 20, and the infrared cut filter 22. Accordingly, the solid-state imaging element 11, the glass substrate 20, and the infrared cut filter 22 are integrally configured. In other words, the CSP solid-state imaging element 10 and the infrared cut filter 22 are integrally configured. Further, the fixing agent 25 has a function to reduce stray light that comes from a side of the CSP solid-state imaging element 10. For example, the fixing agent 25 may be formed using matte black synthetic resin or synthetic resin colored in matte black.

As described above, in the element unit 3a, the adhesive agent 21 and the glass substrate 20 are laminated in this order on the light-receiving surface of the solid-state imaging element 11, and the infrared cut filter 22 is further laminated on the glass substrate 20 via the cavity layer 23. Meanwhile, the glass substrate 20, the adhesive agent 21, and the infrared cut filter 22 are made of materials having approximately the same refractive indices.

Here, as described above, the glass substrate 20 that is thinner than the infrared cut filter 22 is used. As one example, if a thickness of the infrared cut filter 22 is about 200 micrometers (μm) to 250 μm, a thickness of the glass substrate 20 is set to about 30 μm to 110 μm. The thickness of the glass substrate 20 may be set to about 10 μm to 110 μm. Further, the height of the cavity layer 23, that is, the height of the spacer 24 is not specifically limited, but may be set to about 10 μm to a several tens of micrometers.

The fixing unit 13 is connected to the CSP solid-state imaging element 10 and the infrared cut filter 22 via the fixing agent 25. Accordingly, the CSP solid-state imaging element 10 and the infrared cut filter 22 are fixed to the fixing unit 13. Further, the actuator 31 is mounted on an upper surface portion of the fixing unit 13, and the optical unit 2a is fixed to the element unit 3a.

In the element unit 3a, the circuit substrate 12 is electrically connected to a connection part that is included in the CSP solid-state imaging element 10. Further, the circuit substrate 12 is connected to the circuit substrate 15 via the fixing unit 13 and is further connected to a connector 16 via the circuit substrate 15. The connector 16 is connectable to an outside terminal. In other words, a pixel signal output from the solid-state imaging element 11 is supplied to the connector 16 via the circuit substrate 12, the fixing unit 13, and the circuit substrate 15, and is output to outside.

Furthermore, circuit components 14, such as a capacitor needed to drive the solid-state imaging element 11 and the actuator 31, a resistive element, and an integrated circuit for controlling the actuator 31, are mounted on the fixing unit 13, for example. The circuit substrates 12 and 15 are connected to the circuit components 14 via the fixing unit 13. Meanwhile, it is preferable that the circuit substrate 12 is made of a material with a linear expansion coefficient that is close to (similar to) a linear expansion coefficient of silicon that is a material of the solid-state imaging element 11. Moreover, it is preferable that the circuit substrate 12 is made of a material with a lower elastic modulus than a predetermined elastic modulus.

As illustrated in FIG. 1B, position fixing units 181, 182, 183 and 184 are arranged at predetermined positions on the fixing unit 13. The position fixing units 181 to 184 are arranged to make it possible to easily arrange the CSP solid-state imaging element 10 at an appropriate position in an opening of the fixing unit 13. In other words, the position fixing units 181 to 184 are configured such that four corner portions of the CSP solid-state imaging element 10 are fitted in the respective position fixing units. With use of the position fixing units 181 to 184, even in a state before the fixing agent 25 is injected into the fixing unit 13, it is possible to guide and fix the CSP solid-state imaging element 10 to an appropriate position on the circuit substrate 12 with the aid of action of gravity.

Meanwhile, the position fixing units 181 to 184 are configured to have certain sizes such that when the CSP solid-state imaging element 10 is arranged at the appropriate position in the opening of the fixing unit 13, an extremely slight gap is formed between the position fixing units and the CSP solid-state imaging element 10 to the extent that intersection is allowable. In contrast, if warpage, distortion, contraction, or the like occurs in the CSP solid-state imaging element 10, the position fixing units 181 to 184 are able to come into contact with the CSP solid-state imaging element 10 and guide the CSP solid-state imaging element 10 to the appropriate position. In this manner, the position fixing units 181 to 184 are structures that prevent occurrence of inclination and deviation of the CSP solid-state imaging element 10 due to warpage, distortion, contraction, or the like of the CSP solid-state imaging element 10.

Therefore, the CSP solid-state imaging element 10, by being mounted so as to be fitted to the fixing unit 13 such that the four corner portions are aligned with the respective position fixing units 181 to 184, receives the action of gravity due to the own weight, and can be arranged so as to be guided to the appropriate position on the circuit substrate 12 by the position fixing units 181 to 184.

Furthermore, after the CSP solid-state imaging element 10 is guided to and arranged at the appropriate position on the circuit substrate 12, the position fixing units 181 to 184 prevent positional deviation that may occur when the fixing agent 25 is injected into a space between the CSP solid-state imaging element 10 and the fixing unit 13. Therefore, even if the fixing agent 25 may be deformed before the fixing agent 25 is dried and fixed (cured), it is possible to prevent occurrence of distortion, warpage, and inclination of the CSP solid-state imaging element 10 with respect to the circuit substrate 12. As described above, the fixing agent 25 is also intended to prevent reflection after being cured. Therefore, it is preferable that the fixing agent 25 has smaller reflectance than a predetermined value, for example, reflectance of 5% or smaller.

As described above, in the imaging apparatus 1a according to the first embodiment, the glass substrate 20 is arranged on the light-receiving surface of the CSP solid-state imaging element 10 via the adhesive agent 21, and the infrared cut filter 22 is further arranged via the cavity layer 23 that is formed with the spacer 24. Therefore, even if the thickness of the glass substrate 20 is extremely reduced (for example, about 10 μm to several tens of micrometers), it is possible to ensure adequate strength.

Figure 3A:
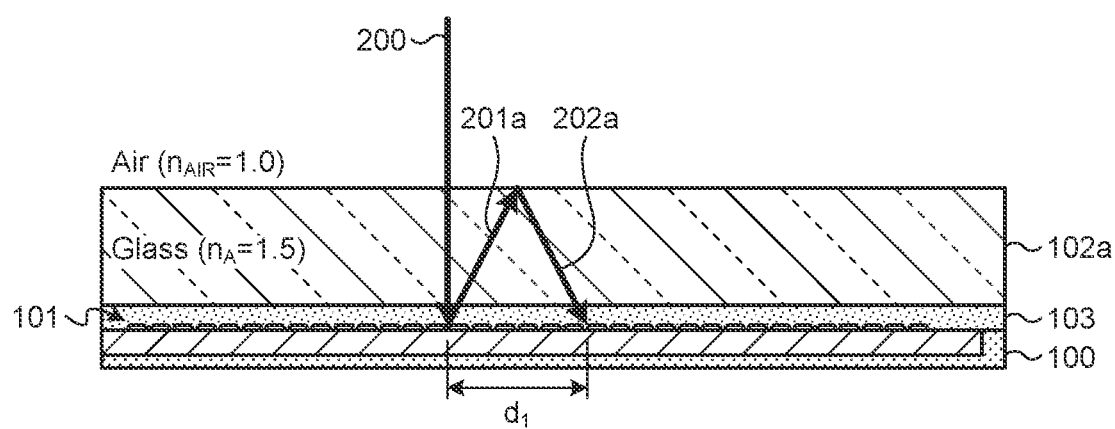
FIG. 3A is a diagram for explaining an example in which a thickness of a glass substrate is large.
Figure 3B:
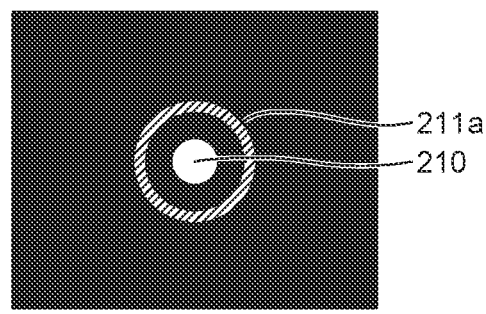
FIG. 3B is a diagram for explaining an example in which the thickness of the glass substrate is large.

Effects that are achieved when the thickness of the glass substrate 20 is reduced will be described below. First, FIG. 3A and FIG. 3B are diagrams for explaining an example in which the thickness of the glass substrate 20 is large. FIG. 3A schematically illustrates a state in which a glass substrate 102a is laminated on a light-receiving surface 101 of a solid-state imaging element 100 via an adhesive agent 103. In the light-receiving surface 101, a microlens is arranged for each of pixels.

Here, it is assumed that a refractive index $n_A$ of the glass substrate 102a is set such that, for example, $n_A=1.5$, and a refractive index $n_B$ of the adhesive agent 103 is set to approximately the same as that of the glass substrate 102a, that is, the refractive index $n_B=1.5$. Further, a surface of the glass substrate 102a that is not in contact with the adhesive agent 103 comes into contact with air. Here, it is assumed that a refractive index $n_{AIR}$ of air is set such that $n_{AIR}=1.0$. Furthermore, in general, a refractive index $n_C$ of the solid-state imaging element 100 is larger than the refractive indices $n_A$ and $n_B$ of the adhesive agent 103 and the glass substrate 102a. For example, if it is assumed that a refractive index n of the microlens arranged on the light-receiving surface 101 of the solid-state imaging element 100 is set such that n=1.8, it is possible to assume that the refractive index n of 1.8 is equal to the refractive index $n_C$ of the solid-state imaging element 100.

In this case, as illustrated in FIG. 3A, light flux 200 of light incident on the solid-state imaging element 11 is reflected by, for example, the microlens on the light-receiving surface 101 of the solid-state imaging element 11. Reflected light 201a that occurs due to reflection of the light flux 200 by the light-receiving surface 101 transmits the adhesive agent 103, enters the glass substrate 102a, and is reflected by a boundary between the glass substrate 102a and air. Reflected light 202a reaches the light-receiving surface 101 of the solid-state imaging element 11 and enters the solid-state imaging element 11 again. This phenomenon is generally referred to as total reflection, and it is known that this phenomenon occurs when light transmits from a material with higher refractive index to a material with lower refractive index. Hereinafter, the reflected light 202a that is reflected by the boundary with air will be referred to as the folded reflected light 202a.

FIG. 3B is a diagram schematically illustrating an image of a captured image that is captured by the solid-state imaging element 100 under the condition as illustrated in FIG. 3A. It is known that if light beams from a light source are applied to a certain surface, an image of the light source is projected with certain expansion on the surface. The light flux 200 in the example in FIG. 3A is applied to the light-receiving surface 101 with certain expansion and is received by the light-receiving element. FIG. 3B illustrates an example of an image 210 that is obtained when the light flux 200 is directly received and captured by the light-receiving element. For example, even if a light source of the light flux 200 is a point light source, the image 210 has certain expansion.

Further, the folded reflected light 202a is applied from a position at which the light flux 200 enters the light-receiving surface 101 to a position separated by a distance $d_1$ that corresponds to a total thickness of the adhesive agent 103 and the glass substrate 102a, and is received by the light-receiving element.

If the distance $d_1$ is larger than a radius of the image 210, a circular image 211a with a radius of the distance $d_1$ from a central point of the image 210 formed with the light flux 200 is captured. The image 211a is referred to as flare or ghost with respect to the image 210, and leads to degradation of image quality of an image that is captured by the solid-state imaging element 100.

Figure 4A:
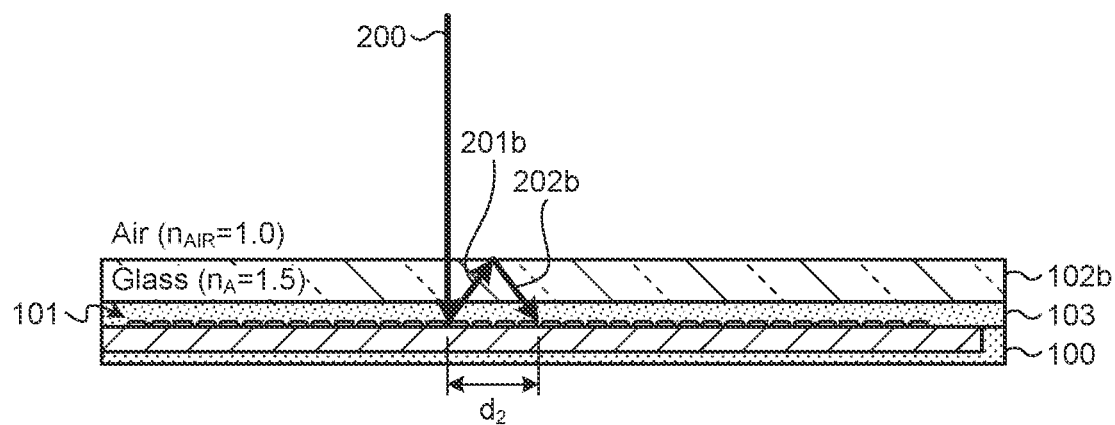
FIG. 4A is a diagram for explaining an example in which the thickness of the glass substrate is small.
Figure 4B:
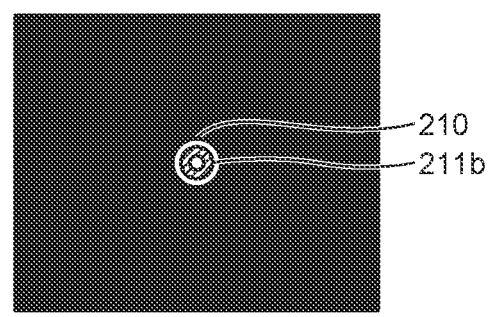
FIG. 4B is a diagram for explaining an example in which the thickness of the glass substrate is small.

FIGS. 4A and 4B are diagrams corresponding to FIGS. 3A and 3B as described above, and are diagrams for explaining a case in which the thickness of the glass substrate 20 is smaller than the case illustrated in FIG. 3A. Meanwhile, in FIG. 4A, it is assumed that the refractive indices of a glass substrate 102b, the adhesive agent 103, and the solid-state imaging element 100 are the same as the refractive indices nA, nB, and nC of the glass substrate 102a, the adhesive agent 103, and the solid-state imaging element 100 explained with reference to FIG. 3A. Further, it is assumed that the thickness of the adhesive agent 103 is the same between the example in FIG. 3A and the example in FIG. 4A.

In FIG. 4A, if the thickness of the glass substrate 102b is smaller than the thickness of the glass substrate 102a illustrated in FIG. 3A, a distance $d_2$ between a position at which folded reflected light 202b of the light flux 200 is applied to the light-receiving surface 101 and a position at which the light flux 200 enters the light-receiving surface 101 is smaller than the distance $d_1$ as described above. Here, if a total thickness of the glass substrate 102b and the adhesive agent 103 is smaller than a predetermined value, as illustrated in FIG. 4B, an image 211b that is formed with the folded reflected light 202b falls in a range of the image 210 that is formed with the light flux 200. In other words, by reducing the thicknesses of the glass substrate 102b and the adhesive agent 103 by a certain value or larger, it is possible to prevent flare and ghost that may occur in the image captured by the solid-state imaging element 100, so that it is possible to expect improvement in image quality of a captured image.

However, if the thicknesses of the glass substrate 102b and the adhesive agent 103 that are arranged on the solid-state imaging element 100 are reduced, the strength of the solid-state imaging element 100 is reduced, so that when the solid-state imaging element 100 is included in the CSP solid-state imaging element, the entire strength of the CSP solid-state imaging element is reduced. In this case, for example, it becomes difficult to obtain a good result in a reliability test, such as a drop test, in an apparatus using the CSP solid-state imaging element including the solid-state imaging element 100.

In contrast, the imaging apparatus 1a according to the first embodiment is configured such that, as described above with reference to FIG. 1A, the infrared cut filter 22 is arranged on the glass substrate 20 via the cavity layer 23. Light that enters the light-receiving surface of the solid-state imaging element 11 and is reflected by the light-receiving surface is further reflected by the boundary between the glass substrate 20 and the cavity layer 23, and enters, as the folded reflected light, the light-receiving surface of the solid-state imaging element 11.

Here, in the imaging apparatus 1a according to the first embodiment, the glass substrate 20, the spacer 24 for forming the cavity layer 23, and the infrared cut filter 22 are fixed with the fixing agent 25. Therefore, even if the thickness of the glass substrate 20 is reduced to, for example, a several tens of micrometers, it is possible to ensure the entire strength of the element unit 3a of the imaging apparatus 1a. Therefore, it is possible to fully reduce the thickness of the glass substrate 20, and prevent occurrence of flare and ghost due to the folded reflected light.

Modification of First Embodiment

A modification of the first embodiment will be described below. The modification of the first embodiment is an example in which the cavity layer 23 between the glass substrate 20 and the infrared cut filter 22 is formed without using the spacer 24. FIG. 5 is a diagram illustrating one example of a configuration of an imaging apparatus according to the modification of the first embodiment. FIG. 5 illustrates an example of a cross section cut along a plane including an optical axis of light that enters the imaging apparatus.

In an element unit 3b of an imaging apparatus 1b illustrated in FIG. 5, the infrared cut filter 22 is fixed to the CSP solid-state imaging element 10 using filter fixing resin 26 while maintaining a predetermined distance to the glass substrate 20 that is arranged on the CSP solid-state imaging element 10. The filter fixing resin 26 is made of a material capable of preventing light reflection, such as a material colored in matte black, for example. Further, the filter fixing resin 26 is made of a material that can be fixed to the cured fixing agent 25 with adequate strength.

For example, the filter fixing resin 26 is applied to an outer periphery of the CSP solid-state imaging element 10. Before the applied filter fixing resin 26 is cured, the infrared cut filter 22 is arranged on the CSP solid-state imaging element 10 such that four sides come into contact with the filter fixing resin 26 with no gap. If the filter fixing resin 26 is cured, the infrared cut filter 22 is fixed to the CSP solid-state imaging element 10. Accordingly, the cavity layer 23 with a certain height corresponding to an applied state of the filter fixing resin 26 is formed between the glass substrate 20 arranged on the CSP solid-state imaging element 10 and the infrared cut filter 22.

Even in the modification of the first embodiment, similarly to the first embodiment as described above, the infrared cut filter 22 is fixed to the CSP solid-state imaging element 10 including the glass substrate 20 by using the filter fixing resin 26. Therefore, even if the thickness of the glass substrate 20 is reduced to a several tens of micrometers for example, it is possible to ensure the entire strength of the element unit 3a of the imaging apparatus 1a. Consequently, it is possible to fully reduce the thickness of the glass substrate 20, and prevent occurrence of flare and ghost due to the folded reflected light.

Second Embodiment

A second embodiment will be described below. The second embodiment is an example in which the lens group 30a in the imaging apparatus 1a according to the first embodiment described above with reference to FIG. 1 is separated into two groups, such as a lowermost lens included in the lens group 30a and other lenses, and the lowermost lens is arranged on the infrared cut filter 22. Here, the lowermost lens indicates a lens that is arranged at a position closest to the CSP solid-state imaging element 10 among the plurality of lenses included in the lens group 30a.

Figure 6:
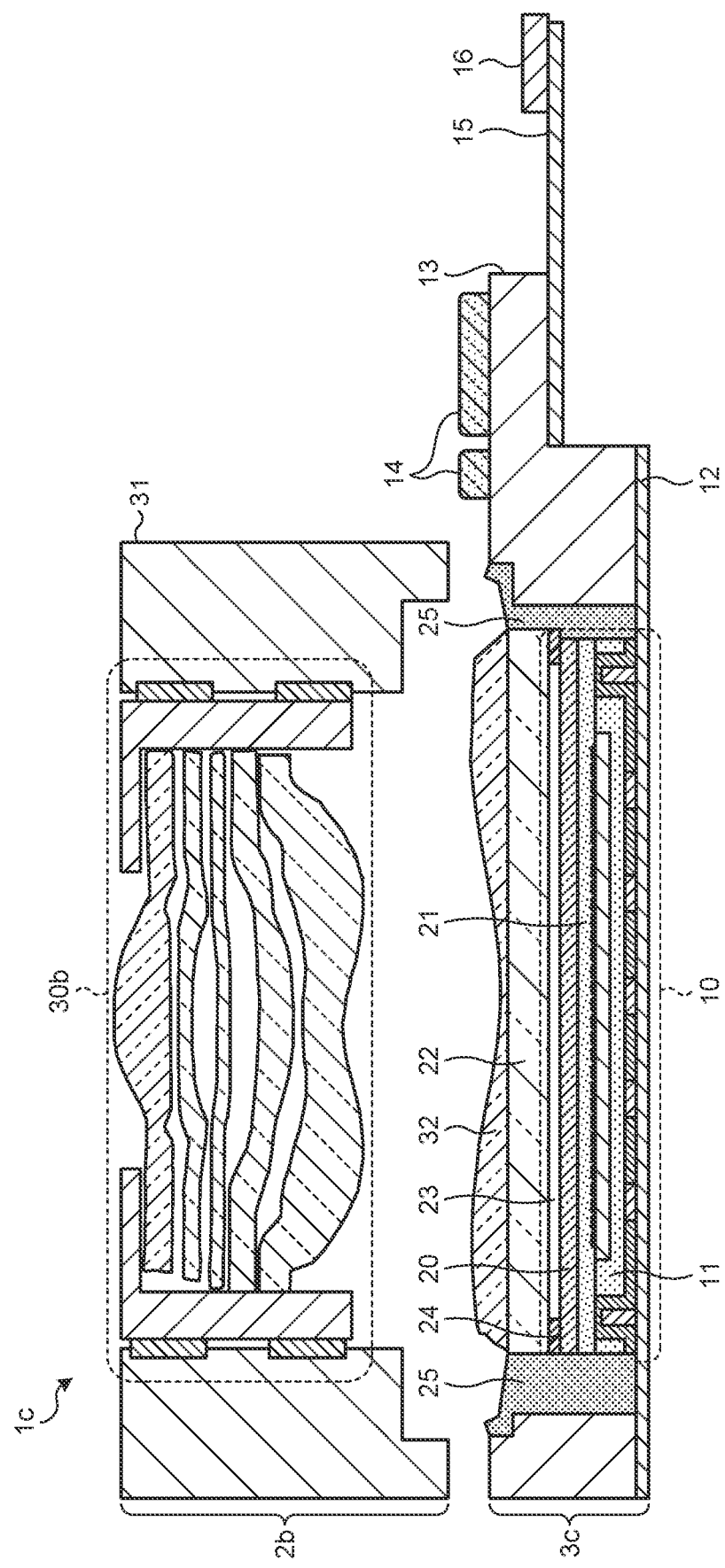
FIG. 6 is a cross-sectional view illustrating one example of a configuration of an imaging apparatus according to a second embodiment.

FIG. 6 is a diagram illustrating one example of a configuration of an imaging apparatus according to the second embodiment. FIG. 6 illustrates an example of a cross section cut along a plane including an optical axis of light that enters the imaging apparatus. An imaging apparatus 1c illustrated in FIG. 6 is configured such that, in an element unit 3c, a lowermost lens 32 included in a lens group for forming an object image on the light-receiving surface is arranged on the infrared cut filter 22. In other words, in an optical unit 2b, a lens group 30b includes all of the lenses except for the lowermost lens 32 of the lens group 30a illustrated in FIG. 1. The lens 32 is bonded and fixed to the infrared cut filter 22 with a transparent adhesive agent, for example.

In the imaging apparatus 1c according to the second embodiment, similarly to the imaging apparatus 1a according to the first embodiment described above with reference to FIG. 1, the glass substrate 20, the spacer 24 for forming the cavity layer 23, and the infrared cut filter 22 are fixed with the fixing agent 25. Therefore, it is possible to reduce the thickness of the glass substrate 20 while ensuring the entire strength of the element unit 3c, so that it is possible to prevent occurrence of flare and ghost due to the folded reflected light.

Furthermore, in the imaging apparatus 1c according to the second embodiment, the lens 32 is fixed to the infrared cut filter 22. Therefore, as compared to the imaging apparatus 1a according to the first embodiment and the imaging apparatus 1b according to the modification of the first embodiment, it is possible to further improve the strength. Consequently, it is possible to further reduce the thickness of the glass substrate 20, and more effectively prevent occurrence of flare and ghost due to the folded reflected light.

First Modification of Second Embodiment

A first modification of the second embodiment will be described below. The first modification of the second embodiment is an example in which the lens group 30a in the imaging apparatus 1a according to the first embodiment described above with reference to FIG. 1 is separated into a lens group 30c including a plurality of lenses on an upper layer side (side on which light from an object enters) and a lens group 30d including a plurality of lenses on a lower layer side, and the lens group 30d is arranged on the infrared cut filter 22.

Figure 7:
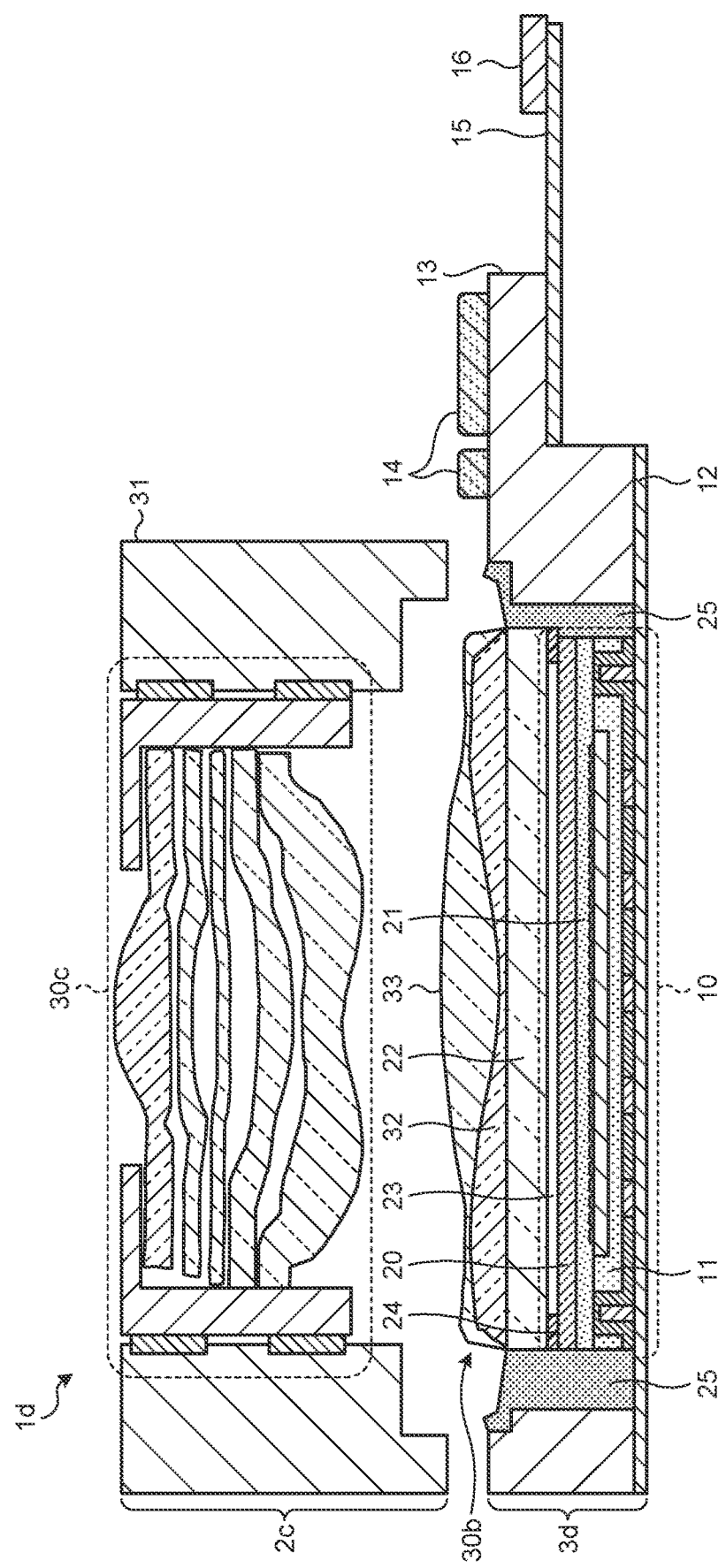
FIG. 7 is a cross-sectional view illustrating one example of a configuration of an imaging apparatus according to a first modification of the second embodiment.

FIG. 7 is a diagram illustrating one example of a configuration of an imaging apparatus according to the first modification of the second embodiment. FIG. 7 illustrates an example of a cross section cut along a plane including an optical axis of light that enters the imaging apparatus. An imaging apparatus 1d illustrated in FIG. 7 is configured such that a lens group for forming an object image on the light-receiving surface of the solid-state imaging element 11 is separated into the lens group 30c and the lens group 30d each including a plurality of lenses. The lens group 30c is included in an optical unit 2c, is driven by the actuator 31, and implements an autofocus function and a camera shake correction function.

The lens group 30d is included in an element unit 3d, and, in the example in FIG. 7, includes the lens 32 that is located in the lowermost layer in the entire lens group and a lens 33 that is located on a next layer. The lenses 32 and 33 are fixed lenses that are not directly related to the autofocus function and the camera shake correction function as described above. The lens 32 and the lens 33 are integrally configured by being bonded with a transparent adhesive agent for example, and the lens 32 is further bonded and fixed to the infrared cut filter 22 with a transparent adhesive agent.

In the imaging apparatus 1d according to the first modification of the second embodiment, similarly to the imaging apparatus 1a according to the first embodiment described above with reference to FIG. 1, the glass substrate 20, the spacer 24 for forming the cavity layer 23, and the infrared cut filter 22 are fixed with the fixing agent 25. Further, in the imaging apparatus 1d according to the first modification of the second embodiment, the integrally configured lenses 32 and 33 are fixed to the infrared cut filter 22. Therefore, as compared to the imaging apparatus 1c according to the second embodiment as described above, it is possible to further improve the strength, further reduce the thickness of the glass substrate 20, and more effectively prevent occurrence of flare and ghost due to the folded reflected light.

Second Modification of Second Embodiment

A second modification of the second embodiment will be described below. The second modification of the second embodiment is an example in which, in the configuration of the imaging apparatus 1d according to the first modification of the second embodiment described above with reference to FIG. 7, a light shielding mask is arranged with respect to the lens 33, which is included in the element unit 3d and to which light from the lens group 30c of the optical unit 2c is directly applied.

Figure 8:
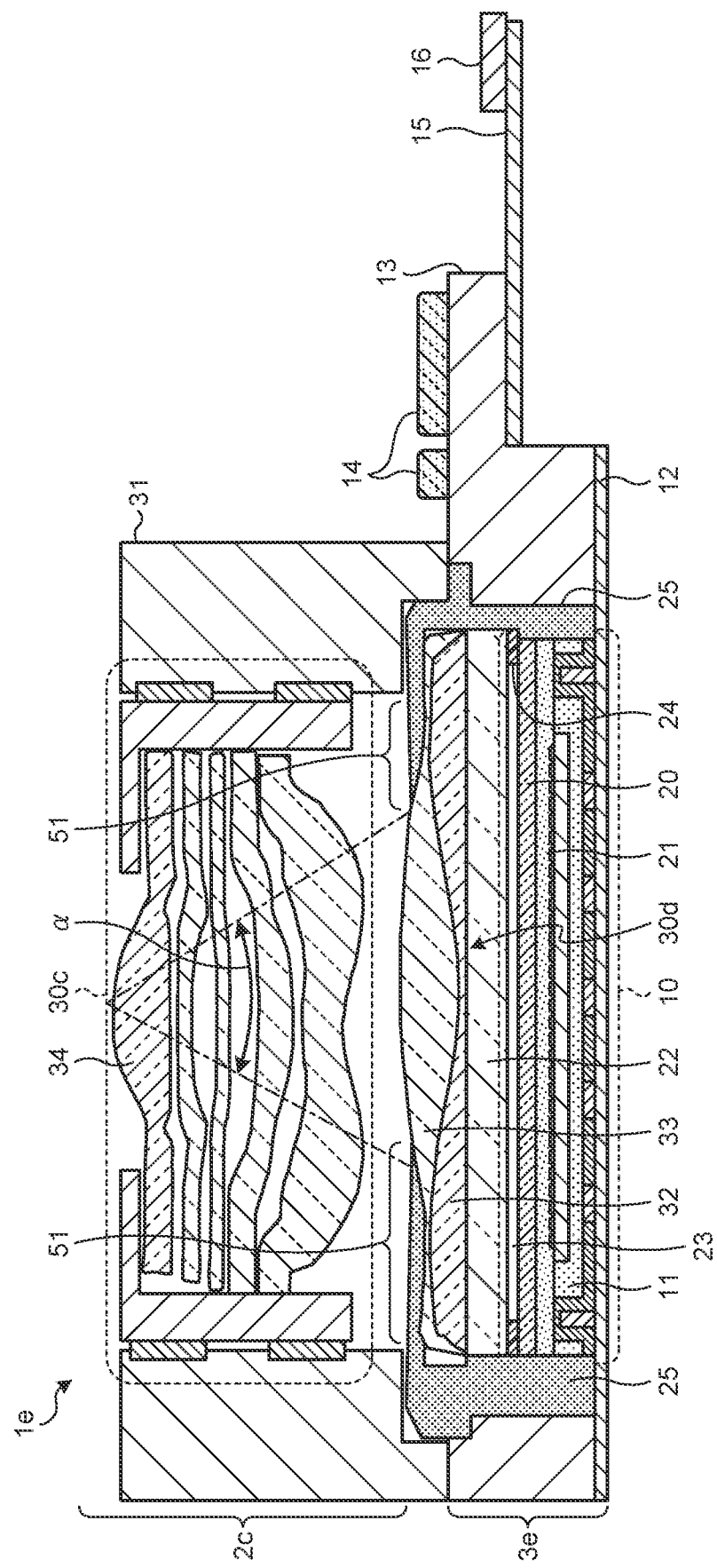
FIG. 8 is a cross-sectional view illustrating one example of a configuration of an imaging apparatus according to a second modification of the second embodiment.

FIG. 8 is a diagram illustrating one example of a configuration of an imaging apparatus according to the second modification of the second embodiment. FIG. 8 illustrates an example of a cross section cut along a plane including an optical axis of light that enters the imaging apparatus. In FIG. 8, an imaging apparatus 1e according to the second modification of the second embodiment is configured such that, similarly to the imaging apparatus 1d described above with reference to FIG. 7, the lens group 30c that is located on the upper layer side and that is separated from the lens group for forming an object image on the light-receiving surface of the solid-state imaging element 11 is included in the optical unit 2c. Further, an element unit 3e includes the lens group 30d that is included on the lower layer side in the lens group. The lens group 30d on the lower layer side includes the lowermost lens 32 that is bonded and fixed to the infrared cut filter 22 and the lens 33 that is bonded and fixed to the lens 32. The configuration is not limited to the above example, and similarly to the imaging apparatus 1c according to the second embodiment as described above with reference to FIG. 6, the element unit 3e may include only the lowermost lens 32 of the lens group.

Here, it is assumed that, for example, light that enters the lens group 30c is emitted from the lens group 30c in a range indicated by an angle α with respect to a center of an uppermost lens 34 of the lens group 30c and enters the lens group 30d. In this case, in the uppermost lens 33 of the lens group 30d, light located outside of the range in which the light from the lens group 30c is applied at the angle α is assumed as unnecessary light when the solid-state imaging element 11 receives light. Therefore, it is preferable to block light such that the light located outside of the range does not enter the solid-state imaging element 11.

In the second modification of the second embodiment, the fixing agent 25 for fixing the solid-state imaging element 11, the glass substrate 20, the spacer 24 for forming the cavity layer 23, and the lens group 30d is applied so as to be extended even to the upper surface of the uppermost lens 33 of the lens group 30d, so that a light shielding mask 51 for the lens 33 is formed. More specifically, the fixing agent 25 is applied so as to be extended from a periphery of the lens 33 to a vicinity of a boundary of the range in which light from the lens group 30c is applied to the lens 33. With this configuration, it is possible to prevent extra light from entering the solid-state imaging element 11, so that it is possible to improve image quality of an image that is captured by the solid-state imaging element 11.

Furthermore, the imaging apparatus 1e according to the second modification of the second embodiment is configured such that, similarly to the imaging apparatus 1d according to the first modification of the second embodiment described above with reference to FIG. 7, the integrally configured lenses 32 and 33 are fixed to the infrared cut filter 22. Therefore, as compared to the imaging apparatus 1c according to the second embodiment as described above, it is possible to further improve the strength, further reduce the thickness of the glass substrate 20, and more effectively prevent occurrence of flare and ghost due to the folded reflected light.

Third Embodiment

A third embodiment will be described below. The third embodiment is an example in which any of the imaging apparatuses 1a to 1e according to the first embodiment, the modification of the first embodiment, the second embodiment, and the plurality of modifications of the second embodiment is applied to an electronic device. In the following, an example in which the imaging apparatus 1a is applied will be described unless otherwise specified.

Figure 9:
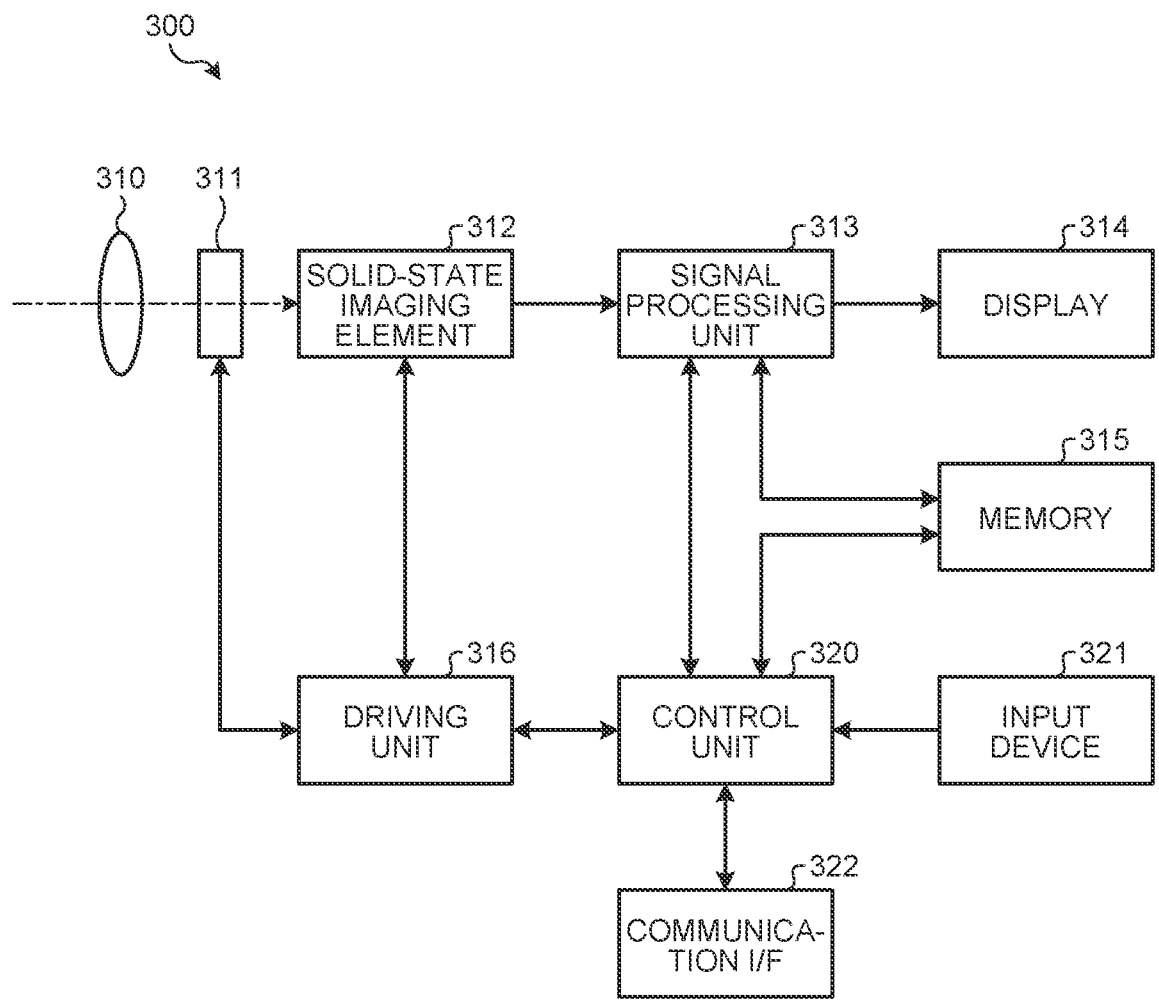
FIG. 9 is a block diagram illustrating one example of a configuration of a terminal device as an electronic device that is applicable to a third embodiment.

FIG. 9 is a block diagram illustrating one example of a configuration of a terminal device 300 as an electronic device that is applicable to the third embodiment. The terminal device 300 is, for example, a multifunctional mobile phone terminal (smartphone), and has an imaging function. The terminal device 300 may be other electronic devices, such as a tablet personal computer, as long as it has the imaging function and it is an electronic device configured in an easily portable manner.

In the example in FIG. 9, the terminal device 300 includes an optical system 310, a shutter device 311, a solid-state imaging element 312, a signal processing unit 313, a display 314, a memory 315, and a driving unit 316. The terminal device 300 further includes a control unit 320, an input device 321, and a communication interface (I/F) 322.

The control unit 320 includes a central processing unit (CPU), a read only memory (ROM), and a random access memory (RAM). The control unit 320 controls entire operation of the terminal device 300 by causing the CPU to operate in accordance with a program that is stored in the ROM in advance, by using the RAM as a work memory. The input device 321 receives user operation, and transmits a control signal corresponding to the received user operation to the control unit 320. The communication I/F 322 performs communication with outside by, for example, wireless communication in accordance with a predetermined protocol under the control of the control unit 320.

The optical system 310 corresponds to the optical unit 2a as described above, includes the lens group 30 including one or more lenses, guides light (incident light) from an object to the solid-state imaging element 312, and forms an image on a light-receiving surface of the solid-state imaging element 312. Further, the optical system 310 may include the actuator 31 as described above. The shutter device 311 is arranged between the optical system 310 and the solid-state imaging element 312, and controls a light application period and a light shielding period with respect to the solid-state imaging element 312 under the control of the control unit 320.

The solid-state imaging element 312 corresponds to the CSP solid-state imaging element 10 as described above, and accumulates signal charges for a predetermined period in accordance with light that is formed on the light-receiving surface of the solid-state imaging element 11 via the optical system 310 and the shutter device 311. The signal charges accumulated in the solid-state imaging element 312 are transferred in accordance with a driving signal (timing signal) that is supplied from the driving unit 316.

The driving unit 316 outputs a driving signal for controlling transfer operation of the solid-state imaging element 312 and shutter operation of the shutter device 311 under the control of the control unit 320, and drives the solid-state imaging element 312 and the shutter device 311.

The signal processing unit 313 performs various kinds of signal processing, such as CDS, on the signal charges output from the solid-state imaging element 312 and generates image data corresponding to the signal charges, under the control of the control unit 320. Furthermore, the signal processing unit 313 is able to display image data, which is obtained through the signal processing, on the display 314 and store the image data in the memory 315, under the control of the control unit 320.

The control unit 320 is able to transmit the image data stored in the memory 315 to outside by the communication I/F 322, in accordance with user operation performed on the input device 321.

The terminal device 300 configured as described above is able to ensure the strength of the solid-state imaging element 312 and reduce the thickness of the glass substrate 20 used in the solid-state imaging element 312, by applying the imaging apparatuses 1a to 1e as described above as the optical system 310 and the solid-state imaging element 312. Therefore, it is possible to prevent flare and ghost in the image data that is captured by the solid-state imaging element 312 and that is subjected to signal processing by the signal processing unit 313, and improve image quality of the image data.

Fourth Embodiment

Figure 10:
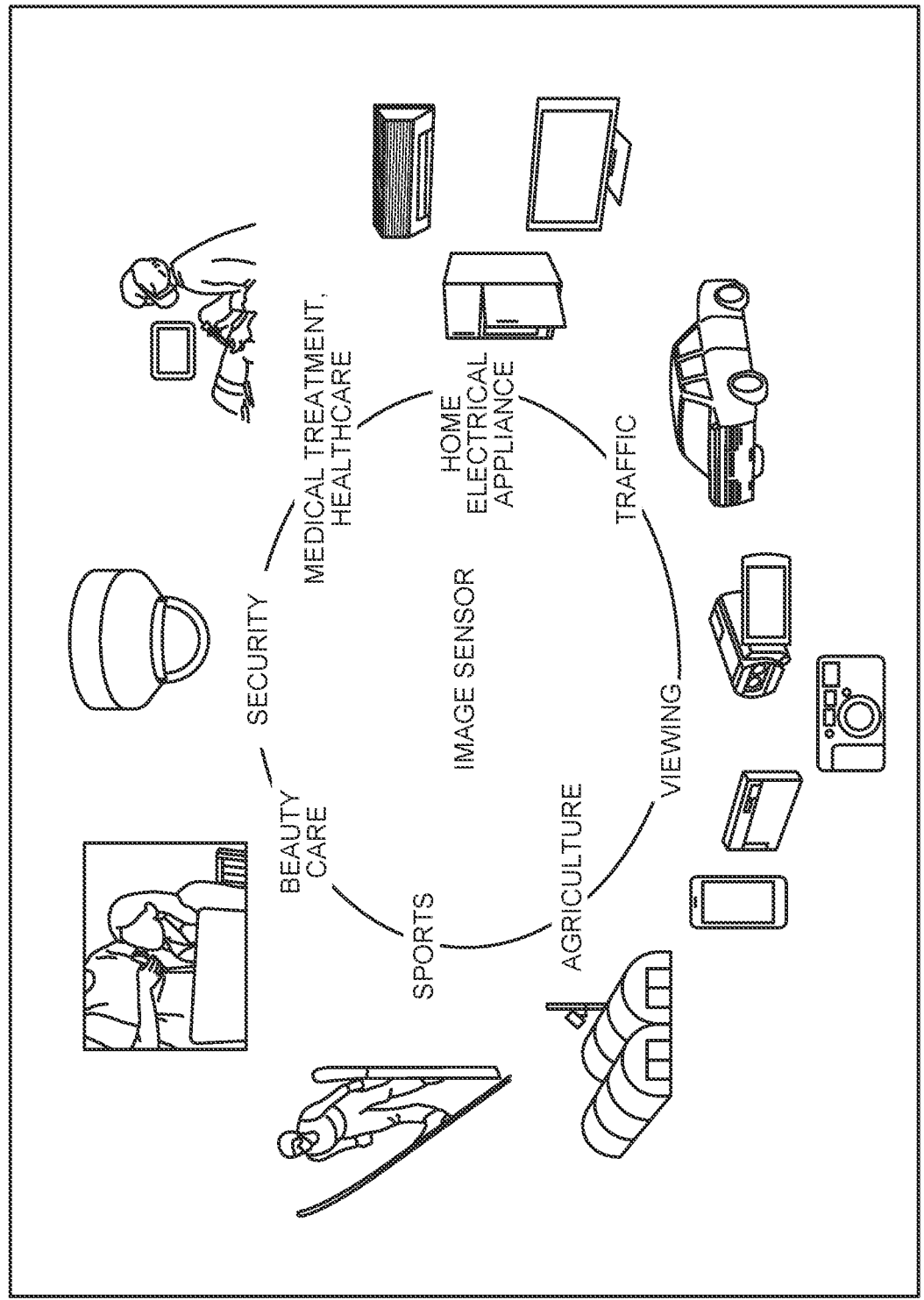
FIG. 10 is a diagram for explaining a use example of an imaging apparatus to which the technique of the present disclosure is applied.

As a fourth embodiment, an example of application of the imaging apparatuses 1a to 1e of the first embodiment, the second embodiment, and the plurality of modifications of the first and the second embodiments according to the present disclosure will be described below. FIG. 10 is a diagram illustrating a use example in which the imaging apparatuses 1a to 1e of the first embodiment, the second embodiment, and the plurality of modifications of the first and the second embodiments according to the present disclosure are used.

Each of the imaging apparatuses 1a to 1e as described above is applicable to various cases in which light, such as visible light, infrared light, ultraviolet light, and X-ray, is sensed as described below.

Apparatuses, such as a digital camera and a mobile phone with a camera function, which capture images to be provided for viewing.

Apparatuses, such as an on-vehicle sensor that captures images of front, back, surroundings, and inside of a vehicle, a monitoring camera that monitors running vehicles and roads, and a distance measurement sensor that measures a distance between vehicles, which are used for traffic to ensure safety driving, such as automatic stop, or to recognize a state of a driver.

Apparatuses that are used for home electrical appliance, such as TV, a refrigerator, and an air conditioner, for capturing an image of a gesture of a user and operating devices in accordance with the gesture.

Apparatuses, such as an endoscope and a device that captures an image of blood vessels by receiving infrared light, which are used for medical treatment and healthcare.

Apparatuses, such as an anti-crime monitoring camera and a camera for person authentication, which are used for security.

Apparatuses, such as a skin measurement device that captures an image of skin and a microscope that captures an image of scalp, which are used for beauty care.

Apparatuses, such as an action camera for sports and a wearable camera, which are used for sports.

Apparatuses, such as a camera for monitoring a state of fields and crops, which are used for agriculture.

Additional Application Examples of Technique According to Present Disclosure

The technique according to the present disclosure (present technique) is applicable to various products. For example, the technique according to the present disclosure may be applied to an endoscopic surgical system.

Example of Application to Intra-Body Information Acquisition System

Figure 11:
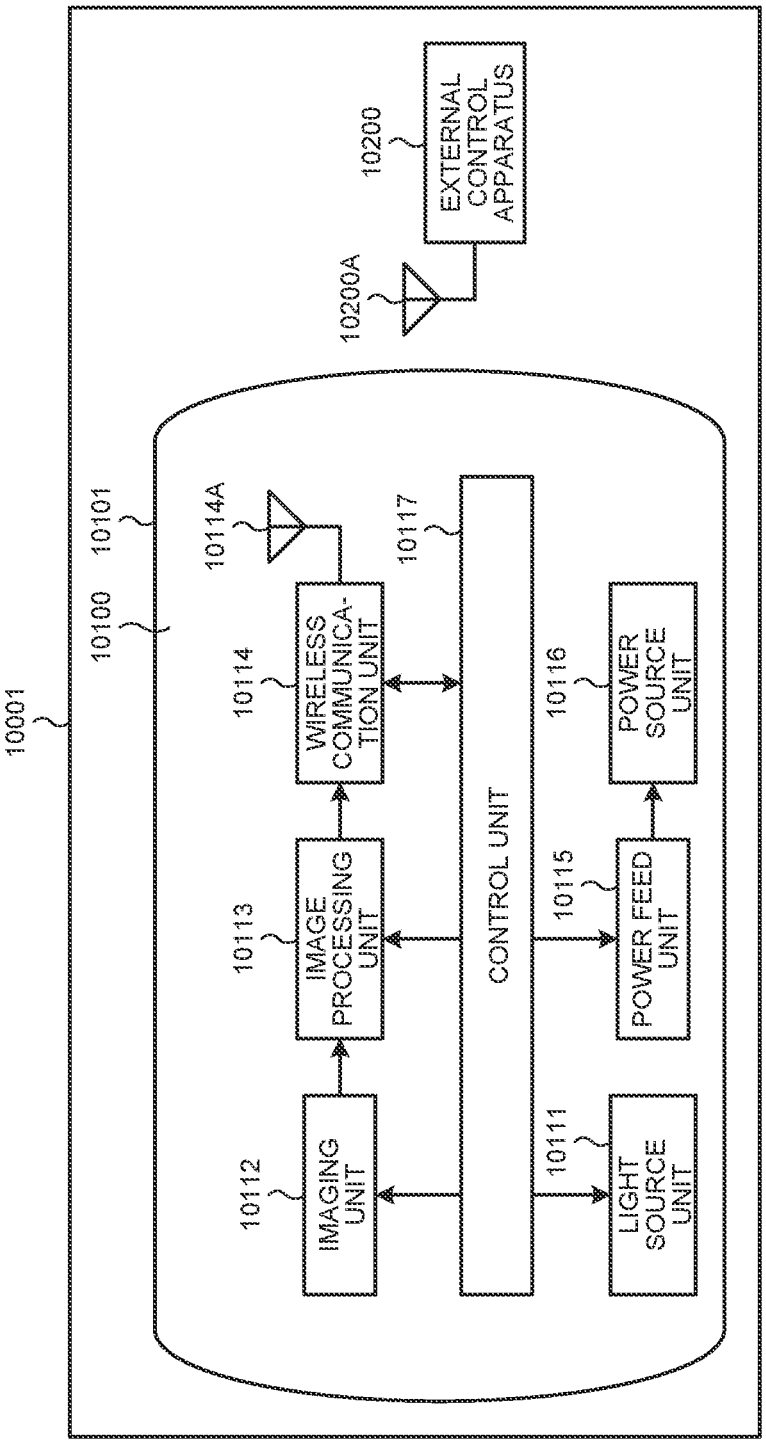
FIG. 11 is a block diagram illustrating one example of a schematic configuration of an intra-body information acquisition system.

FIG. 11 is a block diagram illustrating one example of a schematic configuration of a patient intra-body information acquisition system using a capsule endoscope, to which the technique according to the present disclosure (present technique) is applicable.

An intra-body information acquisition system 10001 includes a capsule endoscope 10100 and an external control apparatus 10200.

The capsule endoscope 10100 is swallowed by a patient at the time of examination. The capsule endoscope 10100 has an imaging function and a wireless communication function, and before naturally being excreted from the patient, moves inside organs, such as a stomach and an intestine, by peristaltic motion, sequentially captures images of inside of the organs (hereinafter, also referred to as intra-body images) at predetermined intervals, and sequentially transmits, by radio, information on the intra-body images to the external control apparatus 10200 located outside of the body.

The external control apparatus 10200 integrally controls operation of the intra-body information acquisition system 10001. Further, the external control apparatus 10200 receives the information on the intra-body images transmitted from the capsule endoscope 10100, and generates image data for displaying the intra-body images on a display apparatus (not illustrated) on the basis of the received information on the intra-body images.

As described above, the intra-body information acquisition system 10001 is able to continually obtain the intra-body images in which the states of the inside of the body of the patient are captured during a period from swallowing to excretion of the capsule endoscope 10100.

Configurations and functions of the capsule endoscope 10100 and the external control apparatus 10200 will be described in detail below.

The capsule endoscope 10100 includes a capsule-shaped casing 10101, and a light source unit 10111, an imaging unit 10112, an image processing unit 10113, a wireless communication unit 10114, a power feed unit 10115, a power source unit 10116, and a control unit 10117 are housed in the casing 10101.

The light source unit 10111 is configured with a light source, such as a light emitting diode (LED), and applies light to an imaging visual field of the imaging unit 10112.

The imaging unit 10112 is configured with an imaging element and an optical system that includes a plurality of lenses arranged in a preceding stage of the imaging element. Reflected light (hereinafter, referred to as observation light) of light that is applied to body tissue as an observation target is collected by the optical system, and enters the imaging element. In the imaging unit 10112, the imaging element performs photoelectric conversion on the incident observation light, and generates an image signal corresponding to the observation light. The image signal generated by the imaging unit 10112 is provided to the image processing unit 10113.

The image processing unit 10113 is configured with a processor, such as a central processing unit (CPU) or a graphics processing unit (GPU), and performs various kinds of signal processing on the image signal that is generated by the imaging unit 10112. The image processing unit 10113 provides, as RAW data, the image signal subjected to the signal processing to the wireless communication unit 10114.

The wireless communication unit 10114 performs a predetermined process, such as a modulation process, on the image signal that is subjected to the signal processing by the image processing unit 10113, and transmits the image signal to the external control apparatus 10200 via an antenna 10114A. Further, the wireless communication unit 10114 receives, from the external control apparatus 10200, a control signal on driving control of the capsule endoscope 10100 via the antenna 10114A. The wireless communication unit 10114 provides the control signal received from the external control apparatus 10200 to the control unit 10117.

The power feed unit 10115 is configured with an antenna coil for receiving power, a power regeneration circuit that regenerates power from an electric current that is generated in the antenna coil, a booster circuit, and the like. The power feed unit 10115 generates power by using the principle of what is called a wireless charging system.

The power source unit 10116 is configured with a secondary battery, and accumulates power generated by the power feed unit 10115. In FIG. 11, to avoid complication of the drawing, arrows or the like indicating power supply destinations from the power source unit 10116 are not illustrated, but the power accumulated in the power source unit 10116 is supplied to and used for drive of the light source unit 10111, the imaging unit 10112, the image processing unit 10113, the wireless communication unit 10114, and the control unit 10117.

The control unit 10117 is configured with a processor, such as a CPU, and appropriately controls drive of the light source unit 10111, the imaging unit 10112, the image processing unit 10113, the wireless communication unit 10114, and the power feed unit 10115 in accordance with the control signal transmitted from the external control apparatus 10200.

The external control apparatus 10200 is configured with a processor, such as a CPU or a GPU, or a microcomputer, a control substrate, or the like on which a processor and a storage element, such as a memory, are mounted together. The external control apparatus 10200 transmits a control signal to the control unit 10117 of the capsule endoscope 10100 via an antenna 10200A, and controls operation of the capsule endoscope 10100. In the capsule endoscope 10100, it is possible to change a light application condition that is used in the light source unit 10111 for the observation target, in accordance with the control signal received from the external control apparatus 10200. Further, it may be possible to change an imaging condition (for example, a frame rate, an exposure value, and the like in the imaging unit 10112) in accordance with the control signal received from the external control apparatus 10200. Furthermore, it may be possible to change a transmission condition (for example, a transmission interval, the number of images to be transmitted, and the like) that is used in the wireless communication unit 10114 for transmission of the image signal, in accordance with the control signal received from the external control apparatus 10200.

Moreover, the external control apparatus 10200 performs various kinds of image processing on the image signal transmitted from the capsule endoscope 10100, and generates image data for displaying the captured intra-body image on the display apparatus. As the image processing, various kinds of signal processing, such as a developing process (a demosaicing process), a high-quality picture process (a bandwidth enhancement process, a super-resolution process, a noise reduction process, a hand-shake correction process, and the like), and an enlargement process (an electronic zoom process), may be performed in an independent manner or in a combined manner. The external control apparatus 10200 controls drive of the display apparatus and displays the captured intra-body image on the basis of the generated image data. Alternatively, the external control apparatus 10200 may cause a recording device (not illustrated) to record the generated image data or a printing device (not illustrated) to print the generated image data.

Thus, one example of the intra-body information acquisition system to which the technique according to the present disclosure is applicable. The technique according to the present disclosure is applicable to, for example, the imaging unit 10112 in the configuration as described above. Specifically, the configuration including the CSP solid-state imaging element 10 and the infrared cut filter 22 in each of the imaging apparatuses 1a to 1e as described above is applicable to the imaging unit 10112. By applying the technique according to the present disclosure to the imaging unit 10112, it is possible to set a deviation between an incident position of incident light of the solid-state imaging element 11 and an incident position of folded reflected light caused by total reflection to approximately constant on the light-receiving surface of the solid-state imaging element 11. Therefore, for example, it is possible to reduce a load related to the image processing performed by the external control apparatus 10200.

Example of Application to Endoscopic Surgical System

Figure 12:
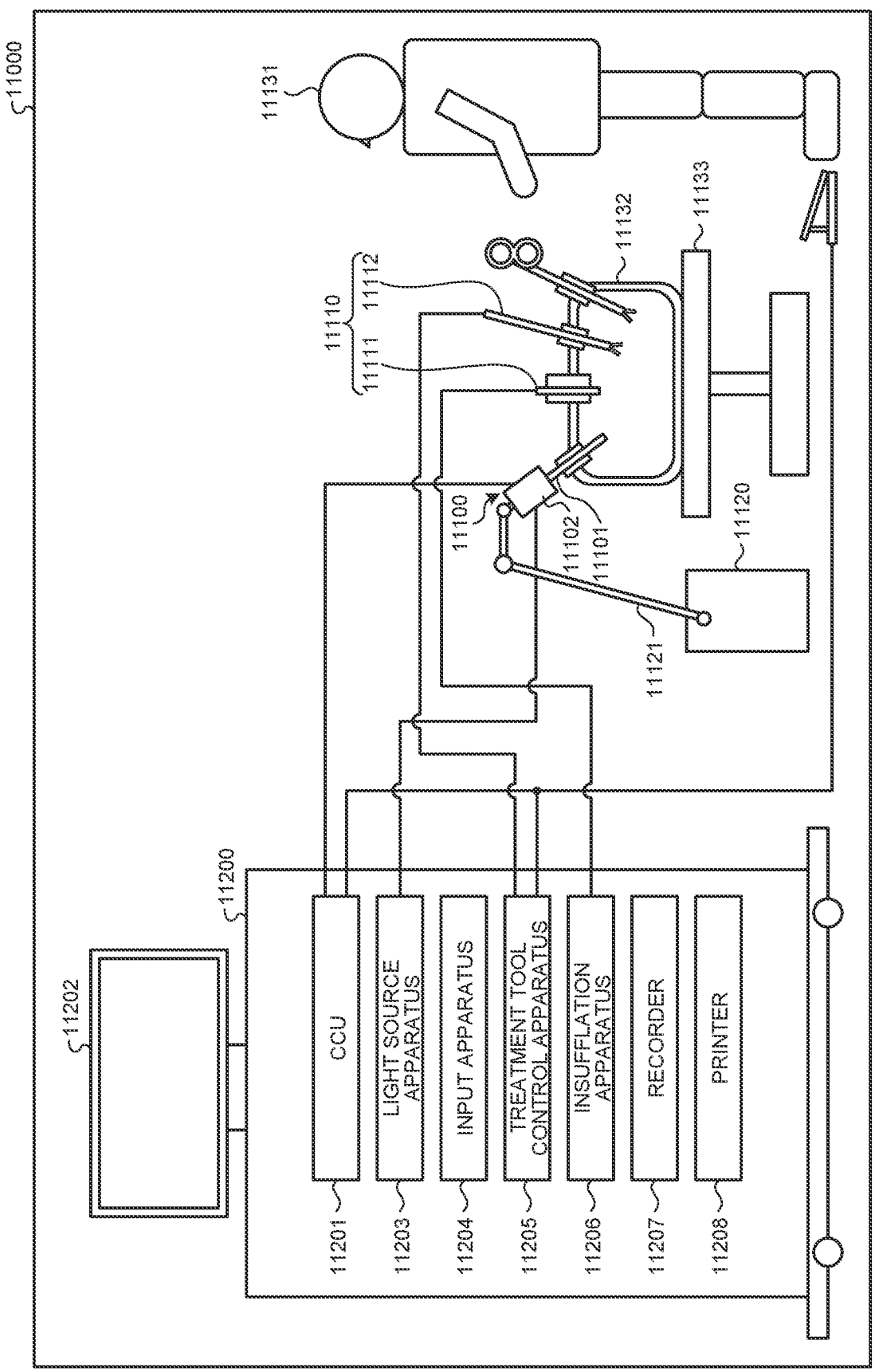
FIG. 12 is a diagram illustrating one example of a schematic configuration of an endoscopic surgical system.

The technique according to the present disclosure may further be applied to an endoscopic surgical system. FIG. 12 is a diagram illustrating an example of a schematic configuration of an endoscopic surgical system to which the technique according to the present disclosure (present technique) is applicable.

FIG. 12 illustrates a situation in which a surgeon (doctor) 11131 performs surgery on a patient 11132 located on a patient bed 11133 by using an endoscopic surgical system 11000. As illustrated in the drawing, an endoscopic surgical system 11000 includes an endoscope 11100, other surgery tools 11110 including an insufflation tube 11111, an energy treatment tool 11112, and the like, a support arm apparatus 11120 for supporting the endoscope 11100, and a cart 11200 on which various apparatuses for endoscopic surgery are mounted.

The endoscope 11100 includes a lens barrel 11101, in which a region with a predetermined length from a distal end thereof is inserted into a body cavity of the patient 11132, and a camera head 11102 that is connected to a proximal end of the lens barrel 11101. In the example illustrated in the drawing, the endoscope 11100 as what is called a rigid scope including the rigid lens barrel 11101 is illustrated, but the endoscope 11100 may be configured as what is called a flexible scope including a flexible lens barrel.

An opening to which an objective lens is fitted is arranged at the distal end of the lens barrel 11101. A light source apparatus 11203 is connected to the endoscope 11100, and light generated by the light source apparatus 11203 is guided to the distal end of the lens barrel by a light guide that is extended inside the lens barrel 11101, and applied to the observation target inside the body cavity of the patient 11132 via the objective lens. Meanwhile, the endoscope 11100 may be a forward-viewing endoscope, a forward-oblique viewing endoscope, or a side-viewing endoscope.

An optical system and an imaging element are arranged inside the camera head 11102, and reflected light (observation light) from the observation target is collected to the imaging element by the optical system. The imaging element performs photoelectric conversion on the observation light, and generates an electrical signal corresponding to the observation light, in other words, an image signal corresponding to an observed image. The image signal is transmitted, as RAW data, to a camera control unit (CCU) 11201.

The CCU 11201 is configured with a CPU, a GPU, or the like, and integrally controls operation of the endoscope 11100 and a display apparatus 11202. Further, the CCU 11201 receives the image signal from the camera head 11102, and performs various kinds of image processing, such as a developing process (demosaicing process), on the image signal for displaying an image based on the image signal.

The display apparatus 11202 displays the image based on the image signal that is subjected to the image processing by the CCU 11201, under the control of the CCU 11201.

The light source apparatus 11203 is configured with a light source, such as a light emitting diode (LED), and supplies illumination light for capturing an image of a surgical site or the like to the endoscope 11100.

An input apparatus 11204 is an input interface for the endoscopic surgical system 11000. A user is able to input various kinds of information and instructions to the endoscopic surgical system 11000 via the input apparatus 11204. For example, the user inputs an instruction or the like to change an imaging condition (a type of illumination light, magnification, a focal length, or the like) of the endoscope 11100.

A treatment tool control apparatus 11205 controls drive of the energy treatment tool 11112 for ablation of tissue, incision, sealing of a blood vessel, or the like. An insufflation apparatus 11206 feeds gas to the inside of the body cavity via the insufflation tube 11111 to insufflate the body cavity of the patient 11132 in order to ensure a visual field of the endoscope 11100 and ensure an operating space for the surgeon. A recorder 11207 is an apparatus capable of recording various kinds of information on surgery. A printer 11208 is an apparatus capable of printing various kinds of information on surgery in various formats, such as text, an image, or a graph.

Meanwhile, the light source apparatus 11203 that supplies, to the endoscope 11100, illumination light that is used at the time of capturing an image of a surgical site may be configured with a white light source that includes an LED, a laser light source, or a combination of the LED and the laser light source, for example. If the white light source is configured with a combination of RGB laser light sources, it is possible to control output intensity and an output timing of each of the colors (each of wavelengths) with high accuracy, so that the light source apparatus 11203 is able to adjust white balance of a captured image. Further, in this case, it is possible to capture an image corresponding to each of RGB in a time-division manner by illuminating an observation target with laser light from each of the RGB laser light sources in a time-division manner and controlling drive of an imaging element of the camera head 11102 in synchronization with illumination timings. With this method, it is possible to obtain a color image even without arranging a color filter on the imaging element.

Furthermore, it may be possible to control drive of the light source apparatus 11203 such that intensity of light to be output is changed at predetermined time intervals. It is possible to generate an image in a highly dynamic range in which what is called blocked up shadows and blown out highlights do not occur, by acquiring images in a time-division manner by controlling the imaging element of the camera head 11102 in synchronization with a timing at which the light intensity is changed, and by combining the acquired images.

Moreover, the light source apparatus 11203 may be configured so as to be able to supply light in a predetermined wavelength band corresponding to special light observation. In the special light observation, for example, what is called narrow band light observation (narrow band imaging) is performed, in which light in a narrower band than that of illumination light (in other words, white light) that is used in normal observation is applied by using wavelength dependence of absorption of light in the body tissue, and predetermined tissue, such as a blood vessel in a superficial portion of a mucous membrane, is captured at high contrast. Alternatively, in the special light observation, fluorescence observation may be performed in which an image is obtained by fluorescence that is generated by applying excitation light. In the fluorescence observation, it may be possible to apply excitation light to body tissue and observe fluorescence from the body tissue (autofluorescence observation), and it may be possible to locally injecting a reagent, such as indocyanine green (ICG), to body tissue and apply excitation light corresponding to a fluorescence wavelength of the reagent to the body tissue to obtain a fluorescence image, for example. The light source apparatus 11203 may be configured so as to be able to supply narrow band light and/or excitation light compatible with the special light observation as described above.

Figure 13:
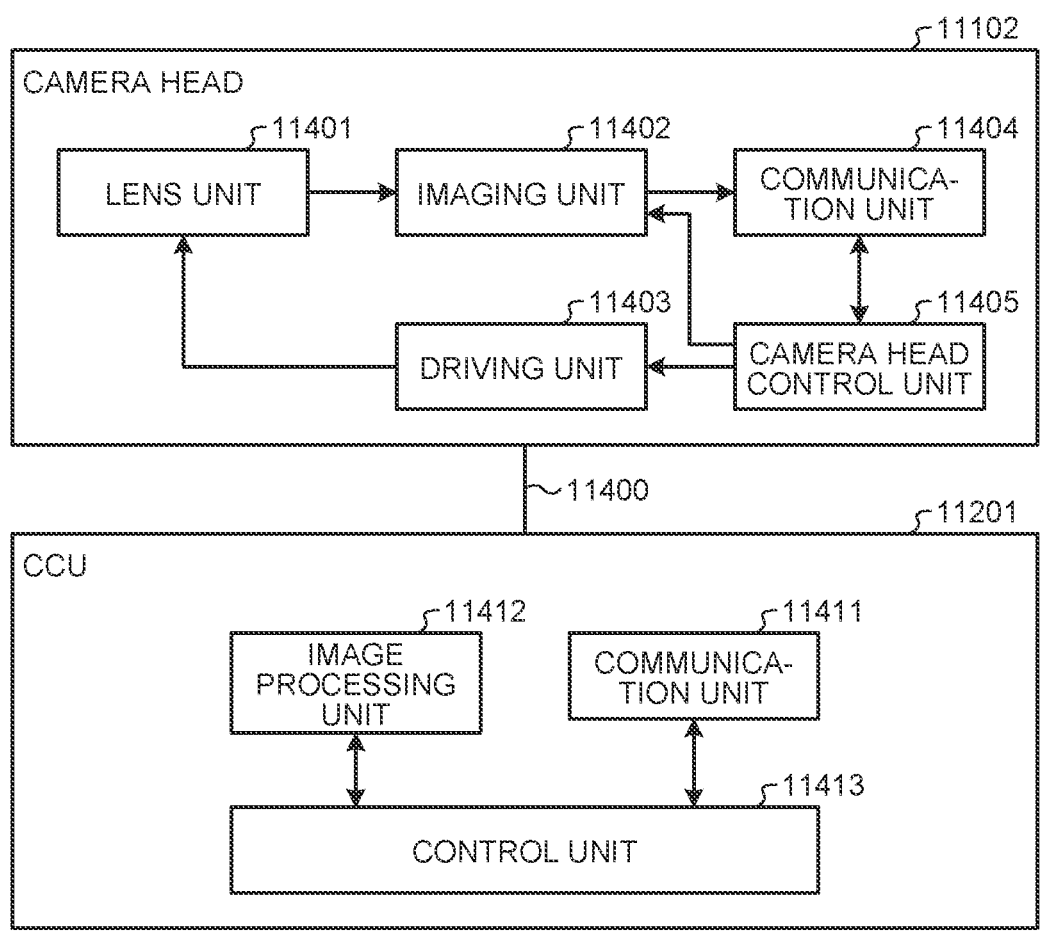
FIG. 13 is a block diagram illustrating one example of functional configurations of a camera head and a CCU.

FIG. 13 is a block diagram illustrating one example of functional configurations of the camera head 11102 and the CCU 11201 illustrated in FIG. 12.

The camera head 11102 includes a lens unit 11401, an imaging unit 11402, a driving unit 11403, a communication unit 11404, and a camera head control unit 11405. The CCU 11201 includes a communication unit 11411, an image processing unit 11412, and a control unit 11413. The camera head 11102 and the CCU 11201 are communicably connected to each other by a transmission cable 11400.

The lens unit 11401 is an optical system that is arranged in a portion connected to the lens barrel 11101. Observation light that is obtained from a distal end of the lens barrel 11101 is guided to the camera head 11102 and enters the lens unit 11401. The lens unit 11401 includes a combination of a plurality of lenses including a zoom lens and a focus lens.

The imaging unit 11402 is configured with an imaging element. The imaging element included in the imaging unit 11402 may be a single element (what is called a single-chip type) or a plurality of elements (what is called a multiple-chip type). If the imaging unit 11402 is configured as a multiple-chip type, for example, each of the imaging elements may generate an image signal corresponding to each of RGB, and a color image may be obtained by combining the image signals. Alternatively, the imaging unit 11402 may be configured to include a pair of imaging elements for acquiring image signals for a right eye and a left eye corresponding to 3-dimensional (3D) display. By performing 3D-display, the surgeon 11131 is able to more accurately recognize a depth of living tissue in the surgical site. Meanwhile, if the imaging unit 11402 is configured as a multiple-chip type, the lens units 11401 may be arranged for a plurality of systems corresponding to the respective imaging elements.

Furthermore, the imaging unit 11402 need not always be arranged in the camera head 11102. For example, the imaging unit 11402 may be arranged on the immediately subsequent stage of the objective lens inside the lens barrel 11101.

The driving unit 11403 is configured with an actuator, and moves the zoom lens and the focus lens of the lens unit 11401 by a predetermined distance along an optical axis, under the control of the camera head control unit 11405. Accordingly, it is possible to appropriately adjust magnification and a focal point of an image captured by the imaging unit 11402.

The communication unit 11404 is configured with a communication device for transmitting and receiving various kinds of information to and from the CCU 11201. The communication unit 11404 transmits, as RAW data, the image signal obtained from the imaging unit 11402 to the CCU 11201 via the transmission cable 11400.

Furthermore, the communication unit 11404 receives, from the CCU 11201, a control signal for controlling drive of the camera head 11102, and supplies the control signal to the camera head control unit 11405. The control signal includes, for example, information on an imaging condition, such as information for designating a frame rate of a captured image, information for designating an exposure value at the time of capturing an image, and/or information for designating magnification and a focal point of a captured image.

Meanwhile, the imaging condition, such as the frame rate, the exposure value, the magnification, and the focal point, may appropriately be designated by a user, or may automatically be set by the control unit 11413 of the CCU 11201 on the basis of the acquired image signal. In the latter case, what is called an auto exposure (AE) function, an autofocus (AF) function, and an auto white balance (AWB) function are equipped in the endoscope 11100.

The camera head control unit 11405 controls drive of the camera head 11102 on the basis of the control signal that is received from the CCU 11201 via the communication unit 11404.

The communication unit 11411 is configured with a communication device for transmitting and receiving various kinds of information to and from the camera head 11102. The communication unit 11411 receives, from the camera head 11102, an image signal that is transmitted via the transmission cable 11400.

Furthermore, the communication unit 11411 transmits, to the camera head 11102, a control signal for controlling drive of the camera head 11102. The image signal and the control signal may be transmitted by electrical communication, optical communication, or the like.

The image processing unit 11412 performs various kinds of image processing on the image signal that is the RAW data transmitted from the camera head 11102.

The control unit 11413 performs various kinds of control on capturing of an image of a surgical site or the like by the endoscope 11100 and display of a captured image that is obtained by capturing the image of the surgical site or the like. For example, the control unit 11413 generates a control signal for controlling drive of the camera head 11102.

Furthermore, the control unit 11413 causes the display apparatus 11202 to display the captured image in which the surgical site or the like appears, on the basis of the image signal that is subjected to the image processing by the image processing unit 11412. At this time, the control unit 11413 may recognize various objects in the captured image by using various image recognition techniques. For example, the control unit 11413 is able to recognize a surgical tool, such as a forceps, a specific living site, bleeding, mist that is generated when the energy treatment tool 11112 is used, or the like by detecting a shape, a color, or the like of an edge of an object included in the captured image. The control unit 11413 may display various kinds of surgery support information on the image of the surgical site in a superimposed manner by using a recognition result when causing the display apparatus 11202 to display the captured image. If the surgery support information is displayed in a superimposed manner and presented to the surgeon 11131, it is possible to reduce a load on the surgeon 11131 and the surgeon 11131 may become able to reliably perform the surgery.

The transmission cable 11400 that connects the camera head 11102 and the CCU 11201 is an electrical signal cable compatible with communication of an electrical signal, an optical fiber compatible with optical communication, or a composite cable of the electrical signal cable and the optical fiber.

Here, in the example of FIG. 13, communication is performed with wire using the transmission cable 11400, but communication between the camera head 11102 and the CCU 11201 may be performed in a wireless manner.

Thus, one example of the endoscopic surgical system to which the technique according to the present disclosure is applicable has been described above. The technique according to the present disclosure is applicable to, for example, the endoscope 11100 and the imaging unit 11402 of the camera head 11102 in the configuration as described above. Specifically, the configuration including the CSP solid-state imaging element 10 and the infrared cut filter 22 in each of the imaging apparatuses 1*a* to 1*e* as described above is applicable to the imaging unit 10402. By applying the technique according to the present disclosure to the imaging unit 11402, it is possible to set a deviation between an incident position of incident light of the solid-state imaging element 11 and an incident position of folded reflected light caused by total reflection to approximately constant on an imaging plane of the solid-state imaging element 1, so that it is possible to reduce a load related to the image processing performed by the CCU 11201, for example.

Meanwhile, the endoscopic surgical system has been described above as one example, but the technique according to the present disclosure may be applied to other systems, such as a microscopic surgical system, for example.

Example of Application to Movable Body

The technique according to the present disclosure may further be applied to an apparatus that is mounted on various movable bodies, such as a vehicle, an electric vehicle, a hybrid electric vehicle, an automatic two-wheel vehicle, a bicycle, a personal mobility, an airplane, a drone, boats and ships, and a robot.

Figure 14:
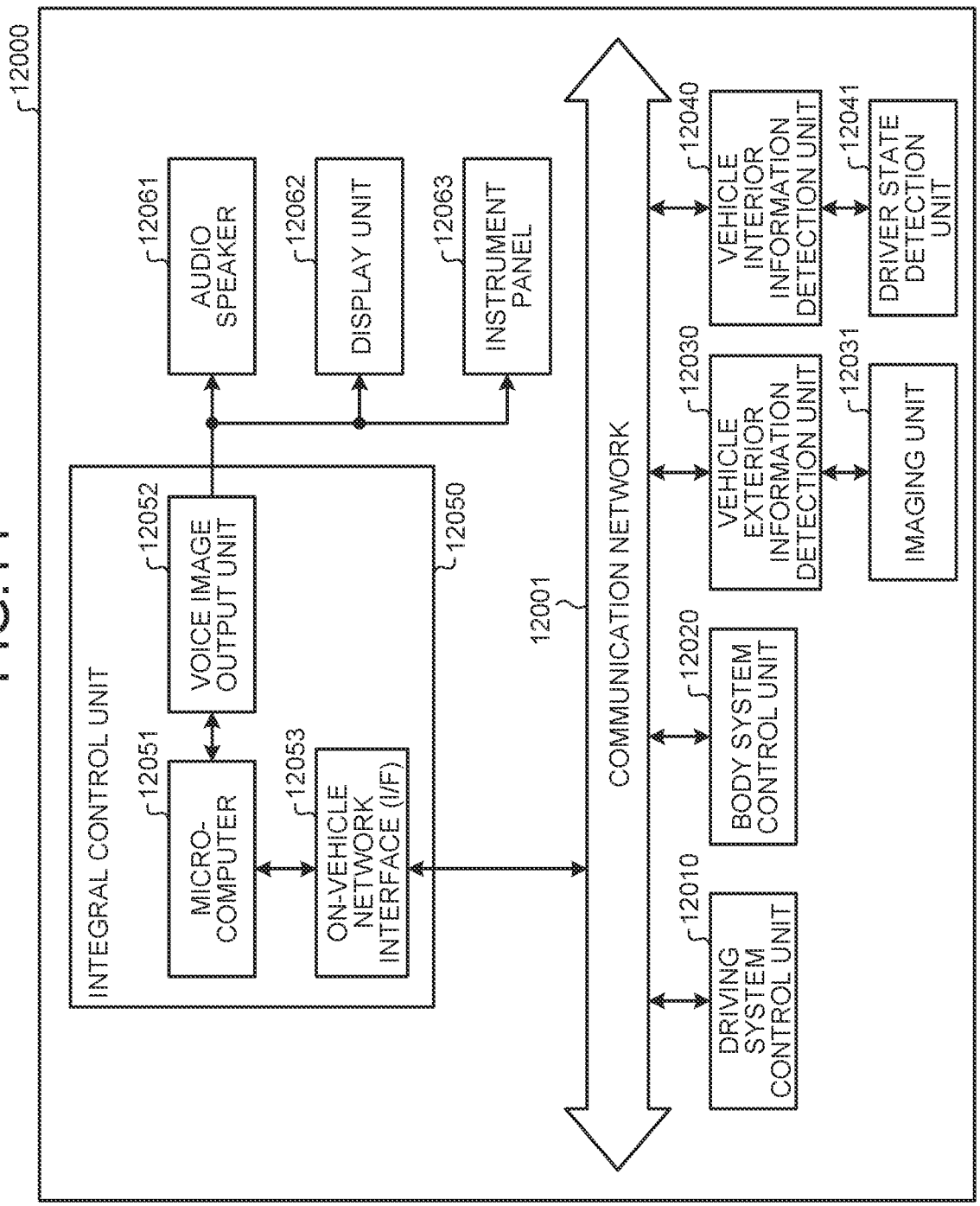
FIG. 14 is a block diagram illustrating one example of a schematic configuration of a vehicle control system.

FIG. 14 is a block diagram illustrating a schematic configuration example of a vehicle control system that is one example of a movable body control system to which the technique according to the present disclosure is applicable.

A vehicle control system 12000 includes a plurality of electronic control units that are connected to one another via a communication network 12001. In the example illustrated in FIG. 14, the vehicle control system 12000 includes a driving system control unit 12010, a body system control unit 12020, a vehicle exterior information detection unit 12030, a vehicle interior information detection unit 12040, and an integral control unit 12050. Further, as a functional configuration of the integral control unit 12050, a microcomputer 12051, a voice image output unit 12052, and an on-vehicle network interface (I/F) 12053 are illustrated.

The driving system control unit 12010 controls operation of apparatuses related to a driving system of a vehicle, in accordance with various programs. For example, the driving system control unit 12010 functions as a control apparatus for a driving force generation apparatus, such as an internal combustion engine or a driving motor, that generates a driving force of the vehicle, a driving force transmission mechanism for transmitting the driving force to wheels, a steering mechanism for adjusting a rudder angle of the vehicle, and a braking apparatus that generates a braking force of the vehicle.

The body system control unit 12020 controls operation of various apparatuses mounted on a vehicle body, in accordance with various programs. For example, the body system control unit 12020 functions as a control apparatus for a keyless entry system, a smart key system, a power window apparatus, and various lamps, such as a head lamp, a back lamp, a brake lamp, a direction indicator, and a fog lamp. In this case, radio waves transmitted from a mobile terminal that is used as a substitute for a key or signals from various switches may be input to the body system control unit 12020. The body system control unit 12020 receives input of the radio waves or the signals, and controls a door lock apparatus, a power window apparatus, lamps, and the like of the vehicle.

The vehicle exterior information detection unit 12030 detects information on the outside of the vehicle on which the vehicle control system 12000 is mounted. For example, an imaging unit 12031 is connected to the vehicle exterior information detection unit 12030. The vehicle exterior information detection unit 12030 causes the imaging unit 12031 to capture an image of the outside of the vehicle, and receives the captured image. The vehicle exterior information detection unit 12030 may perform an object detection process or a distance detection process on a person, a vehicle, an obstacle, a sign, or characters on a road, on the basis of the received image. The vehicle exterior information detection unit 12030 performs image processing on the received image, and performs the object detection process or the distance detection process on the basis of a result of the image processing, for example.

The imaging unit 12031 is an optical sensor that receives light and outputs an electrical signal corresponding to intensity of the received light. The imaging unit 12031 is able to output the electrical signal as an image or information on a measured distance. Further, the light that is received by the imaging unit 12031 may be visible light or non-visible light, such as infrared light.

The vehicle interior information detection unit 12040 detects information on the inside of the vehicle. A driver state detection unit 12041 that detects a state of a driver is connected to the vehicle interior information detection unit 12040, for example. The driver state detection unit 12041 includes a camera that captures an image of the driver for example, and the vehicle interior information detection unit 12040 may calculate a degree of fatigue or a degree of concentration of the driver or may determine whether the driver is sleeping, on the basis of detection information that is input from the driver state detection unit 12041.

The microcomputer 12051 is able to calculate a control target value of the driving force generation apparatus, the steering mechanism, or the braking apparatus, on the basis of the information on the outside or the inside of the vehicle that is acquired by the vehicle exterior information detection unit 12030 or the vehicle interior information detection unit 12040, and issue a control command to the driving system control unit 12010. For example, the microcomputer 12051 is able to perform cooperation control to realize an advance driver assistance system (ADAS) function including vehicle crash avoidance, vehicle impact relaxation, following traveling based on an inter-vehicular distance, vehicle crash warning, or vehicle lane deviation warning.

Moreover, the microcomputer 12051 is able to perform cooperation control to realize automatic driving in which a vehicle autonomously travels independent of operation of a driver for example, by controlling the driving force generation apparatus, the steering mechanism, the braking apparatus, or the like on the basis of information on the surroundings of the vehicle that is acquired by the vehicle exterior information detection unit 12030 or the vehicle interior information detection unit 12040.

Furthermore, the microcomputer 12051 is able to output a control command to the body system control unit 12020 on the basis of the information on the outside of the vehicle that is acquired by the vehicle exterior information detection unit 12030. For example, the microcomputer 12051 is able to control the head lamp in accordance with a position of a preceding vehicle or an oncoming vehicle detected by the vehicle exterior information detection unit 12030, and is able to perform cooperation control to realize anti-glare, such as switching from high beam to low beam.

The voice image output unit 12052 transmits an output signal of at least one of voice and an image to an output apparatus capable of providing visual information or auditory information to a passenger of the vehicle or to the outside of the vehicle. In the example in FIG. 14, an audio speaker 12061, a display unit 12062, and an instrument panel 12063 are illustrated as examples of the output apparatus. The display unit 12062 may include, for example, at least one of an on-board display and a head-up display.

Figure 15:
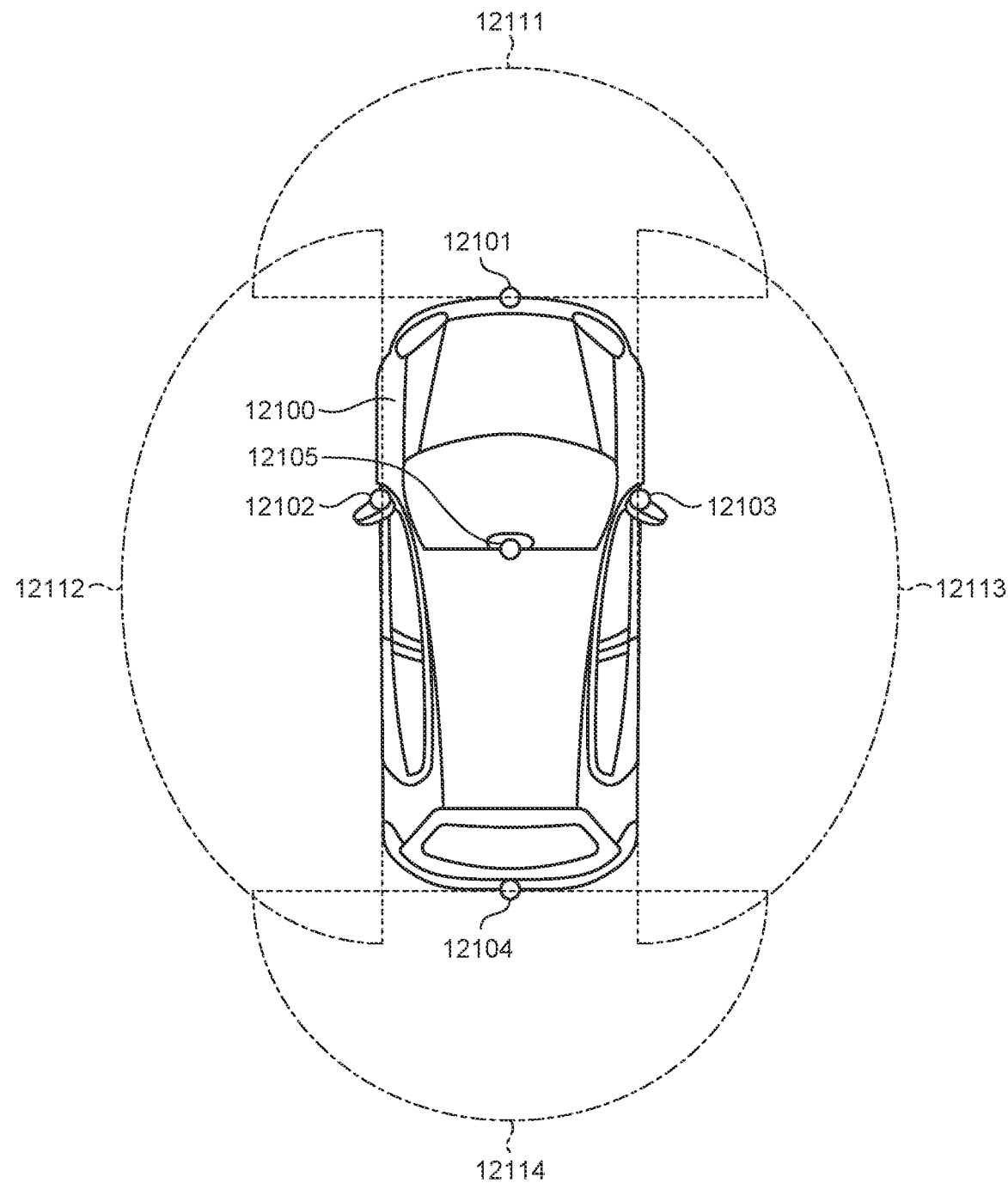
FIG. 15 is an explanatory diagram illustrating one example of installation positions of a vehicle exterior information detection unit and an imaging unit.

FIG. 15 is a diagram illustrating an example of installation positions of the imaging unit 12031. In FIG. 15, a vehicle 12100 includes, as the imaging unit 12031, imaging units 12101, 12102, 12103, 12104, and 12105.

The imaging units 12101, 12102, 12103, 12104, and 12105 are arranged at positions of a front nose, side mirrors, a rear bumper, a back door, or an upper part of a windshield inside the vehicle, and the like of the vehicle 12100, for example. The imaging unit 12101 mounted on the front nose and the imaging unit 12105 mounted on the upper part of the windshield inside the vehicle mainly acquire images of the front of the vehicle 12100. The imaging units 12102 and 12103 mounted on the side mirrors mainly acquire images of the sides of the vehicle 12100. The imaging unit 12104 mounted on the rear bumper or the back door mainly acquires an image of the rear of the vehicle 12100. The front image acquired by the imaging unit 12101 and 12105 is mainly used to detect a preceding vehicle, a pedestrian, an obstacle, a traffic signal, a traffic sign, a traffic lane, or the like.

Meanwhile, FIG. 15 illustrates one example of imaging ranges of the imaging units 12101 to 12104. An imaging range 12111 indicates an imaging range of the imaging unit 12101 arranged on the front nose, imaging ranges 12112 and 12113 indicate imaging ranges of the imaging units 12102 and 12103 arranged on the respective side mirrors, and an imaging range 12114 indicates an imaging range of the imaging unit 12104 arranged on the rear bumper or the back door. For example, by superimposing pieces of image data captured by the imaging units 12101 to 12104, a downward image of the vehicle 12100 viewed from above is obtained.

At least one of the imaging units 12101 to 12104 may have a function to acquire distance information. For example, at least one of the imaging units 12101 to 12104 may be a stereo camera including a plurality of imaging elements, or may be an imaging element including a pixel for detecting a phase difference.

For example, by obtaining a distance to each of stereoscopic objects in the imaging ranges 12111 to 12114 and obtaining a temporal change in the distance (relative speed with respect to the vehicle 12100) on the basis of the distance information obtained from the imaging units 12101 to 12104, the microcomputer 12051 is able to particularly detect, as a preceding vehicle, a stereoscopic object that is located closest to the vehicle 12100 on a road on which the vehicle 12100 travels and that travels at a predetermined speed (for example, 0 km/h or higher) in approximately the same direction as the vehicle 12100. Further, the microcomputer 12051 is able to set, in advance, an inter-vehicular distance that needs to be ensured on the near side of the preceding vehicle, and perform automatic braking control (including following stop control), automatic acceleration control (including following starting control), and the like. In this manner, it is possible to perform cooperation control to realize automatic driving or the like in which running is autonomously performed independent of operation of a driver.

For example, the microcomputer 12051 is able to classify and extract stereoscopic object data related to a stereoscopic object as a two-wheel vehicle, a normal vehicle, a heavy vehicle, a pedestrian, or other stereoscopic objects, such as a power pole, on the basis of the distance information obtained from the imaging units 12101 to 12104, and use the stereoscopic object data to automatically avoid an obstacle. For example, the microcomputer 12051 identifies an obstacle around the vehicle 12100 as an obstacle that can be viewed by the driver of the vehicle 12100 or an obstacle that can hardly be viewed by the driver. Then, the microcomputer 12051 determines a crash risk indicating a degree of risk of crash with each of objects, and if the crash risk is equal to or larger than a set value and there is the possibility that crash occurs, it is possible to support driving to avoid crash by outputting an alarm to the driver via the audio speaker 12061 or the display unit 12062 or performing forcible deceleration or avoidance steering via the driving system control unit 12010.

At least one of the imaging units 12101 to 12104 may be an infrared camera that detects infrared light. For example, the microcomputer 12051 is able to recognize a pedestrian by determining whether a pedestrian is present in the captured images of the imaging units 12101 to 12104. The pedestrian recognition as described above is performed by, for example, a process of extracting feature points in the captured images of the imaging units 12101 to 12104 that serve as the infrared cameras and a process of performing pattern matching on a series of feature points representing a contour of an object to determine whether the object is a pedestrian. If the microcomputer 12051 determines that a pedestrian is present in the captured images of the imaging units 12101 to 12104 and recognizes the pedestrian, the voice image output unit 12052 causes the display unit 12062 to display a rectangular contour line for enhancing the recognized pedestrian in a superimposed manner. Further, the voice image output unit 12052 may cause the display unit 12062 to display an icon or the like that represents the pedestrian at a desired position.

Thus, one example of the vehicle control system to which the technique according to the present disclosure is applicable has been described above. The technique according to the present disclosure is applicable to, for example, the imaging unit 12031 in the configuration as described above. Specifically, the configuration including the CSP solid-state imaging element 10 and the infrared cut filter 22 in each of the imaging apparatuses 1a to 1e as described above is applicable to the imaging unit 12031. By applying the technique according to the present disclosure to the imaging unit 12031, it is possible to set a deviation between an incident position of incident light of the solid-state imaging element 11 and an incident position of folded reflected light caused by total reflection to approximately constant on the imaging plane of the solid-state imaging element 11. Therefore, for example, it is possible to reduce a load related to the image processing or the like in the vehicle exterior information detection unit 12030.

Further, the effects described in this specification are merely illustrative or exemplified effects, and are not limitative, and, other effects may be achieved.

Additionally, the present technology may also be configured as below.

(1) An imaging apparatus comprising:
    a solid-state imaging element that has a light-receiving surface on which light-receiving elements are arranged in a two-dimensional matrix manner;
    a glass substrate that is arranged on the light-receiving surface of the solid-state imaging element; and
    an infrared cut filter that is arranged on a second surface of the glass substrate via a cavity layer, the second surface located opposite to a first surface facing the light-receiving surface.

(2) The imaging apparatus according to (1), wherein a thickness of the glass substrate is smaller than a thickness of the infrared cut filter.

(3) The imaging apparatus according to (1) or (2), further comprising:
    a spacer that is arranged between the infrared cut filter and the second surface of the glass substrate, and used to form the cavity layer, wherein
    the spacer is made with a material capable of preventing light reflection.

(4) The imaging apparatus according to claim (3), wherein the spacer includes a ventilation pathway that allows communication between inside and outside of the cavity layer.

(5) The imaging apparatus according to any one of (1) to (4), wherein the solid-state imaging element, the glass substrate, and the infrared cut filter are fixed using a fixing agent capable of preventing light reflection.

(6) The imaging apparatus according to any one of (1) to (5), wherein the glass substrate is arranged on the light-receiving surface via a transparent material.

(7) The imaging apparatus according to any one of (1) to (6), wherein at least one lens among lenses included in a lens group that forms an object image on the light-receiving surface is fixedly arranged on the infrared cut filter.

(8) The imaging apparatus according to (7), further comprising:
a light shielding mask that is arranged on an incidence surface of the at least one lens and that is capable of blocking light outside of a range in which light emitted from the lens group is incident on the incidence surface.

(9) The imaging apparatus according to claim (8), wherein the light shielding mask is formed by extending the fixing agent for fixing the solid-state imaging element, the glass substrate, and the infrared cut filter to the incidence surface.

REFERENCE SIGNS LIST 1a, 1b, 1c, 1d, 1e imaging apparatus
2a, 2b, 2c optical unit
3a, 3b, 3c, 3d, 3e element unit
10 CSP solid-state imaging element
11, 100, 312 solid-state imaging element
20, 102a, 102b glass substrate
21, 103 adhesive agent
22 infrared cut filter
23 cavity layer
24 spacer
25 fixing agent
30a, 30b, 30c, 30d lens group
32, 33, 34 lens
40, 40' ventilation pathway
51 light shielding mask
101 light-receiving surface
300 terminal device
313 signal processing unit
315 memory
320 control unit

The invention claimed is:

1. An imaging apparatus, comprising:
a solid-state imaging element that has a light-receiving surface on which light-receiving elements are in a two-dimensional matrix manner;
a glass substrate that is on the light-receiving surface of the solid-state imaging element; and
an infrared cut filter that is on a surface of the glass substrate via a cavity layer, wherein
the surface of the glass substrate is located opposite to a surface facing the light-receiving surface, and
a thickness of the glass substrate is smaller than a thickness of the infrared cut filter.

2. The imaging apparatus according to claim 1, further comprising:
a spacer that is between the infrared cut filter and the surface of the glass substrate, wherein
the cavity layer comprises the spacer, and
the spacer comprises a material capable of preventing light reflection.

3. The imaging apparatus according to claim 2, wherein the spacer includes a ventilation pathway that allows communication between inside and outside of the cavity layer.

4. The imaging apparatus according to claim 1, wherein the solid-state imaging element, the glass substrate, and the infrared cut filter are fixed using a fixing agent capable of preventing light reflection.

5. The imaging apparatus according to claim 1, wherein the glass substrate is on the light-receiving surface via a transparent material.

6. The imaging apparatus according to claim 1, wherein at least one lens among lenses included in a lens group that forms an object image on the light-receiving surface is fixedly arranged on the infrared cut filter.

7. The imaging apparatus according to claim 6, further comprising:
a light shielding mask that is on an incidence surface of the at least one lens,
wherein the light shielding mask is capable of blocking light outside of a range in which light, emitted from the lens group, is incident on the incidence surface.

8. The imaging apparatus according to claim 7, wherein the light shielding mask comprises an extension of a fixing agent for fixing the solid-state imaging element, the glass substrate, and the infrared cut filter to the incidence surface.

9. An imaging apparatus, comprising:
a solid-state imaging element that has a light-receiving surface on which light-receiving elements are in a two-dimensional matrix manner;
a glass substrate that is on the light-receiving surface of the solid-state imaging element;
an infrared cut filter that is on a surface of the glass substrate via a cavity layer, wherein the surface of the glass substrate is located opposite to a surface facing the light-receiving surface; and
a spacer that is between the infrared cut filter and the surface of the glass substrate, wherein
the cavity layer comprises the spacer,
the spacer comprises a material capable of preventing light reflection, and
the spacer includes a ventilation pathway that allows communication between inside and outside of the cavity layer.

10. An imaging apparatus, comprising:
a solid-state imaging element that has a light-receiving surface on which light-receiving elements are in a two-dimensional matrix manner;
a glass substrate that is on the light-receiving surface of the solid-state imaging element;
an infrared cut filter that is on a surface of the glass substrate via a cavity layer, wherein
the surface of the glass substrate is located opposite to a surface facing the light-receiving surface, and
at least one lens among lenses included in a lens group that forms an object image on the light-receiving surface is fixedly arranged on the infrared cut filter; and
a light shielding mask that is on an incidence surface of the at least one lens, wherein
the light shielding mask is capable of blocking light outside of a range in which light, emitted from the lens group, is incident on the incidence surface, and
the light shielding mask comprises an extension of a fixing agent for fixing the solid-state imaging element, the glass substrate, and the infrared cut filter to the incidence surface.

* * * * *